United States Patent
Abe

(10) Patent No.: US 10,265,948 B2
(45) Date of Patent: Apr. 23, 2019

(54) LIQUID EJECTING APPARATUS, DRIVE CIRCUIT, AND HEAD UNIT

(71) Applicant: SEIKO EPSON CORPORATION, Tokyo (JP)

(72) Inventor: Akira Abe, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 47 days.

(21) Appl. No.: 15/417,439

(22) Filed: Jan. 27, 2017

(65) Prior Publication Data

US 2017/0246861 A1  Aug. 31, 2017

(30) Foreign Application Priority Data

Feb. 26, 2016 (JP) ................................. 2016-034995

(51) Int. Cl.
*B41J 2/045* (2006.01)
*H01L 41/09* (2006.01)

(52) U.S. Cl.
CPC ....... *B41J 2/04541* (2013.01); *B41J 2/04581* (2013.01); *H01L 41/09* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,852,128 B2 | 12/2010 | Kitazawa et al. | | |
| 8,491,074 B2* | 7/2013 | Miyazaki | ............. | B41J 2/04541 307/70 |
| 8,919,902 B2* | 12/2014 | Aoki | ................... | B41J 2/04581 347/10 |
| 9,120,307 B2* | 9/2015 | Abe | ...................... | B41J 2/04541 |
| 9,156,250 B2* | 10/2015 | Abe | ...................... | B41J 2/04541 |
| 9,358,781 B2* | 6/2016 | Abe | ...................... | B41J 2/04541 |
| 9,421,762 B1* | 8/2016 | Abe | ...................... | B41J 2/04588 |
| 9,427,958 B2* | 8/2016 | Abe | ...................... | B41J 2/04541 |
| 9,555,625 B2* | 1/2017 | Abe | ...................... | B41J 2/04541 |
| 9,849,670 B2* | 12/2017 | Yamada | ............... | B41J 2/04588 |
| 9,862,184 B2* | 1/2018 | Abe | ...................... | B41J 2/04541 |
| 9,908,329 B2* | 3/2018 | Yamada | ............... | B41J 2/04573 |
| 9,925,766 B2* | 3/2018 | Abe | ...................... | B41J 2/04541 |
| 9,956,767 B2* | 5/2018 | Abe | ...................... | B41J 2/04588 |

(Continued)

FOREIGN PATENT DOCUMENTS

| | | |
|---|---|---|
| JP | 2009-190287 A | 8/2009 |
| JP | 2010-114711 A | 5/2010 |

*Primary Examiner* — Matthew Luu
*Assistant Examiner* — Lily Kemathe

(57) ABSTRACT

A liquid ejecting apparatus includes an ejecting unit that includes a piezoelectric element which is displaced by a drive signal; a differential amplifier that outputs a control signal based on a source drive signal which is a source signal of the drive signal and a signal based on the drive signal; a pair of transistors that include a high-side transistor and a low-side transistor which are controlled based on the control signal and outputs the drive signal from an output terminal; a selector that selects one of the high-side transistor and the low-side transistor and supplies the control signal to the selected transistor; a first resistance element for pulling up the output terminal; and a second resistance element for pulling down the output terminal. The first resistance element or the second resistance element has a variable resistance value.

9 Claims, 18 Drawing Sheets

(56) References Cited

U.S. PATENT DOCUMENTS

| | | | | |
|---|---|---|---|---|
| 9,981,466 B2* | 5/2018 | Abe | ................ | B41J 2/04518 |
| 10,000,058 B2* | 6/2018 | Yamada | ................ | B41J 2/04588 |
| 10,022,959 B2* | 7/2018 | Inoue | ................ | B41J 2/04541 |
| 10,022,960 B2* | 7/2018 | Nozawa | ................ | B41J 2/04501 |
| 10,035,342 B2* | 7/2018 | Yamada | ................ | B41J 2/04541 |
| 10,044,343 B2* | 8/2018 | Abe | ................ | B41J 2/04593 |
| 10,086,605 B2* | 10/2018 | Abe | ................ | B41J 2/04541 |
| 2009/0179666 A1* | 7/2009 | Chujo | ................ | H04L 25/0278 |
| | | | | 326/30 |
| 2009/0243901 A1* | 10/2009 | Abe | ................ | H03M 1/0604 |
| | | | | 341/118 |
| 2013/0187967 A1* | 7/2013 | Abe | ................ | B41J 2/07 |
| | | | | 347/11 |
| 2015/0246530 A1* | 9/2015 | Abe | ................ | B41J 2/04541 |
| | | | | 347/10 |
| 2015/0273821 A1* | 10/2015 | Abe | ................ | B41J 2/04541 |
| | | | | 347/10 |
| 2015/0328885 A1* | 11/2015 | Abe | ................ | B41J 2/04541 |
| | | | | 347/10 |
| 2015/0375501 A1* | 12/2015 | Abe | ................ | B41J 2/04541 |
| | | | | 323/271 |
| 2016/0352332 A1* | 12/2016 | Abe | ................ | B41J 2/04541 |
| 2017/0113458 A1* | 4/2017 | Abe | ................ | B41J 2/04541 |
| 2017/0246859 A1* | 8/2017 | Abe | ................ | B41J 2/0455 |
| 2017/0246861 A1* | 8/2017 | Abe | ................ | B41J 2/04541 |
| 2017/0246862 A1* | 8/2017 | Abe | ................ | B41J 2/04541 |
| 2017/0250679 A1* | 8/2017 | Abe | ................ | H03K 3/012 |

* cited by examiner

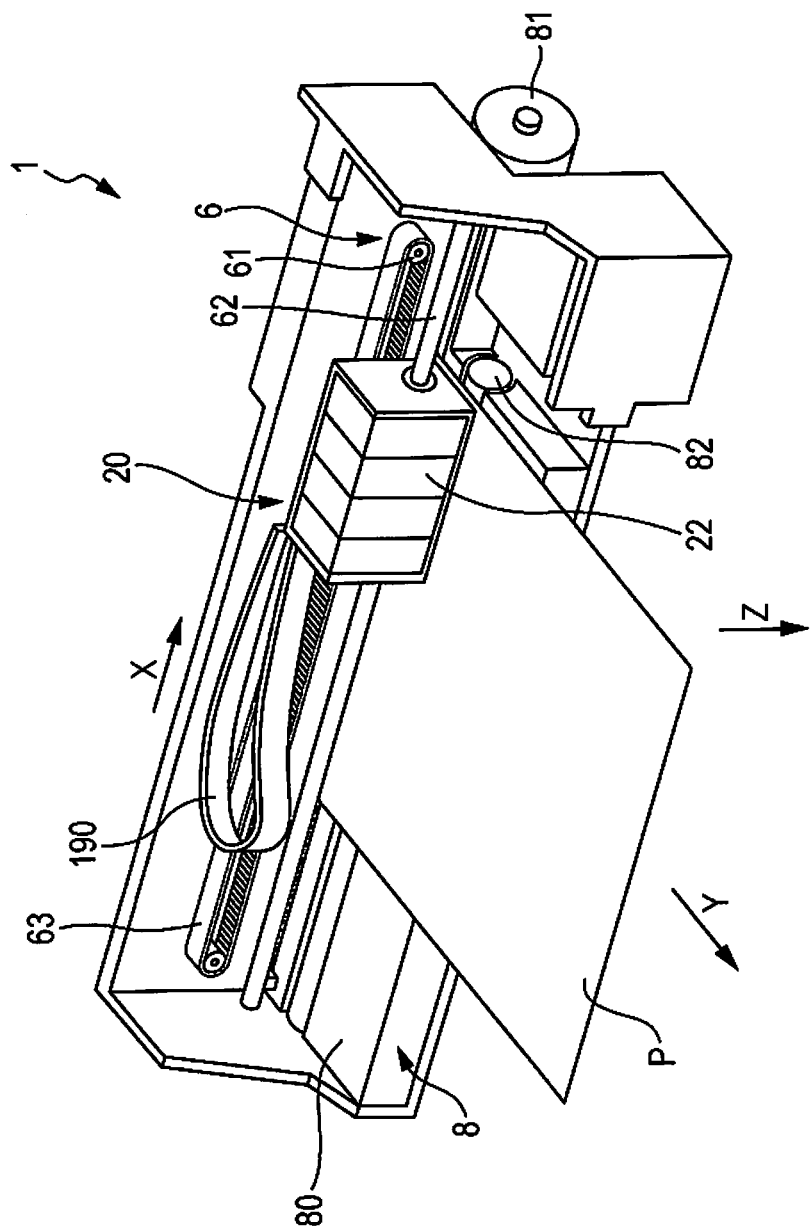

⟨DECODED CONTENT OF DECODER⟩

| PRINT DATA SI | T1 | | T2 | |
|---|---|---|---|---|
| | Sa | Sb | Sa | Sb |
| LARGE DOT → (1, 1) | H | L | H | L |
| MEDIUM DOT → (0, 1) | H | L | L | H |
| SMALL DOT → (1, 0) | L | L | L | H |
| NO RECORD → (0, 0) | L | H | L | L |

MSB  LSB

LIQUID EJECTING APPARATUS, DRIVE CIRCUIT, AND HEAD UNIT

The entire disclosure of Japanese Patent Application No. 2016-034995, filed Feb. 26, 2016 is expressly incorporated by reference herein.

BACKGROUND

1. Technical Field

The present invention relates to a liquid ejecting apparatus, a drive circuit, and a head unit.

2. Related Art

An ink jet printer which uses a piezoelectric element (for example, a piezo element) and which prints an image or a text by ejecting ink is known. Piezoelectric elements are provided in correspondence with multiple nozzles in a head unit, each of the piezoelectric elements is driven in accordance with a drive signal, and thereby, a predetermined amount of ink (liquid) is ejected from the nozzle at a predetermined timing to form dots. The piezoelectric element is electrically a capacitive element like a capacitor, and needs to receive a sufficient current in order to operate the piezoelectric element of each nozzle.

Accordingly, a source drive signal which is a source signal of a drive signal is amplified by an amplification circuit, is supplied to a head unit as a drive signal, and drives the piezoelectric elements. An amplification circuit uses a method (linear amplification, refer to JP-A-2009-190287) of amplifying current for the source drive signal in class AB amplification or the like. However, since power consumption increases and energy efficiency decreases in the linear amplification, a class D amplification is also proposed in recent years (refer to JP-A-2010-114711). In short, in a class D amplification, a pulse width modulation or a pulse density modulation of the source drive signal is performed, a high-side transistor and a low-side transistor that are inserted in series between power supply voltages are switched in accordance with the modulated signal, an output signal which is generated by the switching is filtered by a low pass filter, and thus, the source drive signal is amplified.

Energy efficiency of a class D amplification method is higher than that of a linear amplification method, however, power which is consumed by a low pass filter cannot be ignored, and thus, there is room for improvement in terms of reducing power consumption.

SUMMARY

An advantage of some aspects of the invention is to provide a liquid ejecting apparatus, a drive circuit, and a head unit which reduce power consumption.

A liquid ejecting apparatus according to an aspect of the invention includes an ejecting unit that includes a piezoelectric element which is displaced by a drive signal being applied to the piezoelectric element and ejects liquid in accordance with displacement of the piezoelectric element; a differential amplifier that outputs a control signal based on a source drive signal which is a source signal of the drive signal and a signal based on the drive signal; a pair of transistors that include a high-side transistor and a low-side transistor which are controlled based on the control signal and outputs the drive signal from an output terminal; a selector that selects one of the high-side transistor and the low-side transistor and supplies the control signal to the selected transistor; a first resistance element for pulling up the output terminal; and a second resistance element for pulling down the output terminal. The selector selects a transistor to which the control signal is supplied, based on a logic level of a predetermined select signal. The first resistance element or the second resistance element has a variable resistance value. The resistance value is changed when a difference between a voltage of the source drive signal and a voltage of a signal based on the drive signal is higher than or equal to a threshold value.

According to the liquid ejecting apparatus of the aspect, a low pass filter is not needed compared with a class D amplification method, and thus, power which is consumed by the low pass filter can be ignored and power consumption is reduced by the amount consumed. Furthermore, a waveform of a drive signal is corrected by a change of a pull-up resistance or a pull-down resistance, and thus, it is possible to improve waveform reproducibility. In addition, an operational amplifier, a comparator, or the like can be used for a differential amplifier.

In the liquid ejecting apparatus according to the aspect, a resistance value of the first resistance element or a resistance value of the second resistance element may vary when a voltage of the drive signal is constant.

In the liquid ejecting apparatus according to the aspect, the selector may select a transistor to which the control signal is supplied, based on a logic level of a predetermined select signal, and the select signal may designate selection in the selector, based on a voltage of the source drive signal.

In addition, in the liquid ejecting apparatus according to the aspect, the selector may select the high-side transistor in a period in which a voltage of the drive signal increases, and selects the low-side transistor in a period in which the voltage of the drive signal decreases.

In the liquid ejecting apparatus according to the aspect, the selector may select the high-side transistor in a period in which the drive signal is constant at a voltage higher than or equal to a predetermined threshold voltage, and may select the low-side transistor in a period in which the drive signal is constant at a voltage lower than the predetermined threshold voltage.

In the configuration, the threshold voltage may be lower than a maximum value of a voltage of the drive signal, and may be higher than a minimum value of the voltage of the drive signal.

The liquid ejecting apparatus may be a device which ejects liquid, and includes a three-dimensional shaping apparatus (so-called 3D printer), a textile printing apparatus, or the like, in addition to a printing apparatus which will be described below.

In addition, the invention is not limited to a liquid ejecting apparatus, can be realized in various aspects, and can be conceptualized as a drive circuit which drives a capacitive load such as the piezoelectric element, a head unit of a liquid ejecting apparatus, or the like.

BRIEF DESCRIPTION OF THE DRAWINGS

The invention will be described with reference to the accompanying drawings, wherein like numbers reference like elements.

FIG. 1 is a perspective view illustrating a schematic configuration of a printing apparatus (Example 1) according to an embodiment.

DESCRIPTION OF EXEMPLARY EMBODIMENTS

Figure 2A:
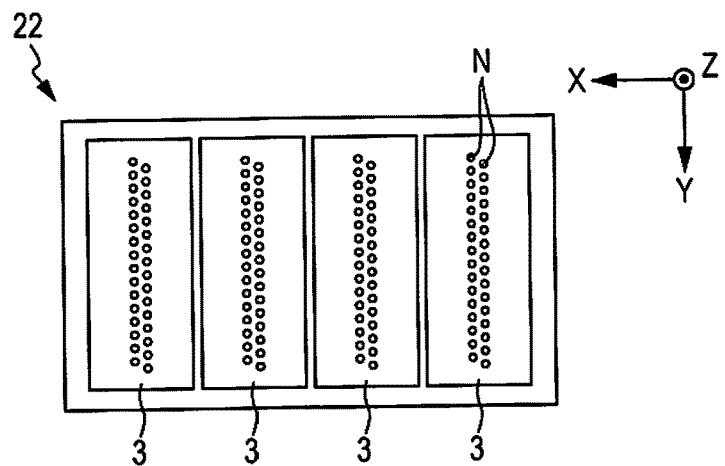
FIG. 2A is a diagram illustrating arrangement or the like of nozzles in a head unit.

Hereinafter, a printing apparatus according to an exemplary embodiment of the invention will be described with reference to the drawings.

FIG. 1 is a perspective view illustrating a schematic configuration of a printing apparatus (Example 1).

The printing apparatus (Example 1) illustrated in this figure is a type of liquid ejecting apparatus which ejects ink that is an example of liquid, thereby, forming an ink dot group on a medium P such as paper, thereby, printing an image (including characters, graphics, or the like).

In the printing apparatus, a symbol is unified by 1 for the sake of convenience, but since there are several aspects as will be describe below, there is a case where parenthesis such as a printing apparatus (Example 1) or a printing apparatus (Example 2) is attached instead of a symbol so that each of them is distinguished.

As illustrated in FIG. 1, the printing apparatus 1 includes a moving mechanism 6 which moves (moves back and forth) a carriage 20 in a main scanning direction (X direction).

The moving mechanism 6 includes a carriage motor 61 which moves the carriage 20, a carriage guide axis 62 both of which are fixed, and a timing belt 63 which extends substantially parallel to the carriage guide axis 62 and is driven by the carriage motor 61.

The carriage 20 is supported by the carriage guide axis 62 so as to move freely back and forth, and is fixed to a part of the timing belt 63. Accordingly, if the timing belt 63 travels forward and backward by the carriage motor 61, the carriage 20 is guided by the carriage guide axis 62 and moves back and forth.

A printing head 22 is mounted in the carriage 20. The printing head 22 includes multiple nozzles which respectively eject ink in the Z direction onto a portion which faces the medium P. The printing head 22 is divided into approximately four blocks for color printing. The multiple blocks respectively eject black (Bk) ink, cyan (C) ink, magenta (M) ink, and yellow (Y).

There is provided a configuration in which various control signals or the like, which include a drive signal from a main substrate (omitted in FIG. 1) through a flexible flat cable 190, are supplied to the carriage 20.

The printing apparatus 1 includes a transport mechanism 8 which transports the medium P on a platen 80. The transport mechanism 8 includes a transport motor 81 which is a drive source, and a transport roller 82 which is rotated by the transport motor 81 and transports the medium P in a sub-scanning direction (Y direction).

In the configuration, an image is formed on a surface of the medium P by ejecting ink in response to print data from the nozzles of the printing head 22 in accordance with main scanning of the carriage 20, and repeating an operation of transporting the medium P in accordance with the transport mechanism 8.

In the present embodiment, the main scanning is performed by moving the carriage 20, but may be performed by moving the medium P, and may be performed by moving both the carriage 20 and the medium P. The point is that there may be provided a configuration in which the medium P and the carriage 20 (printing head 22) move relatively.

FIG. 2A is a diagram illustrating a configuration in a case in which an ejecting surface of ink in the printing head 22 is viewed from the medium P. As illustrated in FIG. 2A, the printing head 22 includes four head units 3. The four head units 3 are arranged in the X direction which is a main scanning direction in correspondence with black (Bk), cyan (C), magenta (M), and yellow (Y), respectively.

Figure 2B:
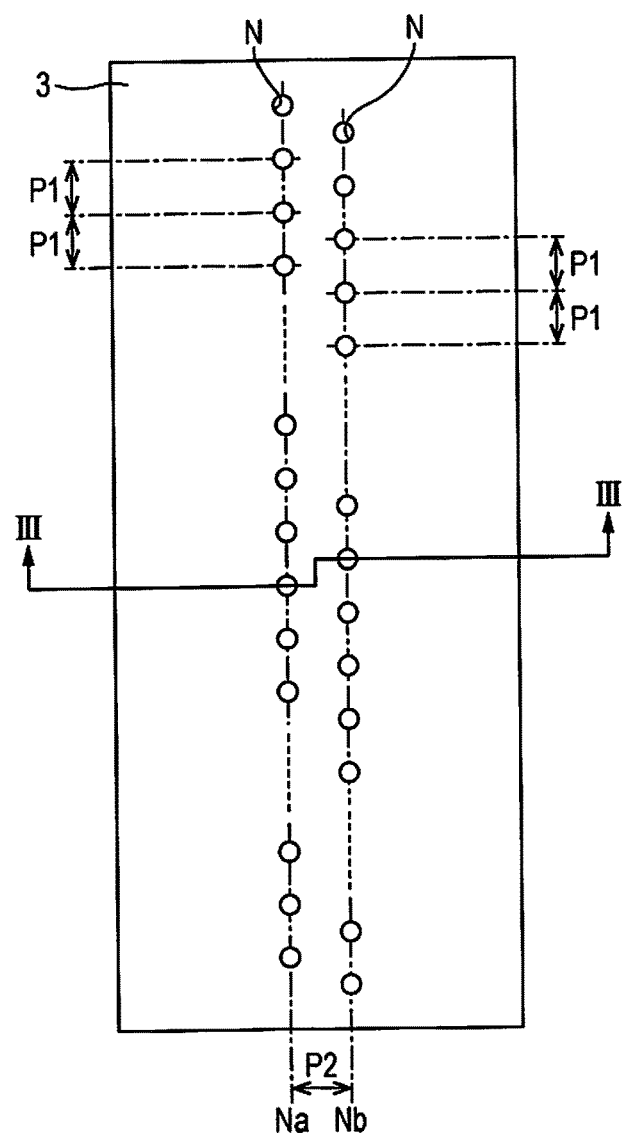
FIG. 2B is a diagram illustrating arrangement or the like of the nozzles in the head unit.

FIG. 2B is a diagram illustrating arrangement of nozzles in one head unit 3.

As illustrated in FIG. 2B, multiple nozzles N are arranged in two columns in one head unit 3. For the sake of convenience, the two columns are respectively referred to as a nozzle column Na and a nozzle column Nb.

Multiple nozzles N are respectively arranged in the Y direction which is a subscan direction by a pitch P1 in the nozzle columns Na and Nb. In addition, the nozzle columns Na and Nb are separated from each other by a pitch P2 in the X direction. The nozzles N in the nozzle column Na are shifted from the nozzles N in the nozzle column Nb by half of the pitch P1 in the Y direction.

In this way, the nozzles N are arranged so as to be shifted by half of the pitch P1 in the two columns of the nozzle columns Na and Nb in the Y direction, and thereby it is possible to increase resolution in the Y direction substantially twice as much as a case of one column.

The number of nozzles N in one head unit 3 is referred to as m (m is an integer greater than or equal to 2) for the sake of convenience.

while not particularly illustrated, the head unit 3 has a configuration in which a flexible circuit board is coupled to an actuator substrate, and a drive IC is mounted on the flexible circuit board. Hence, next, a structure of the actuator substrate will be described.

Figure 3:
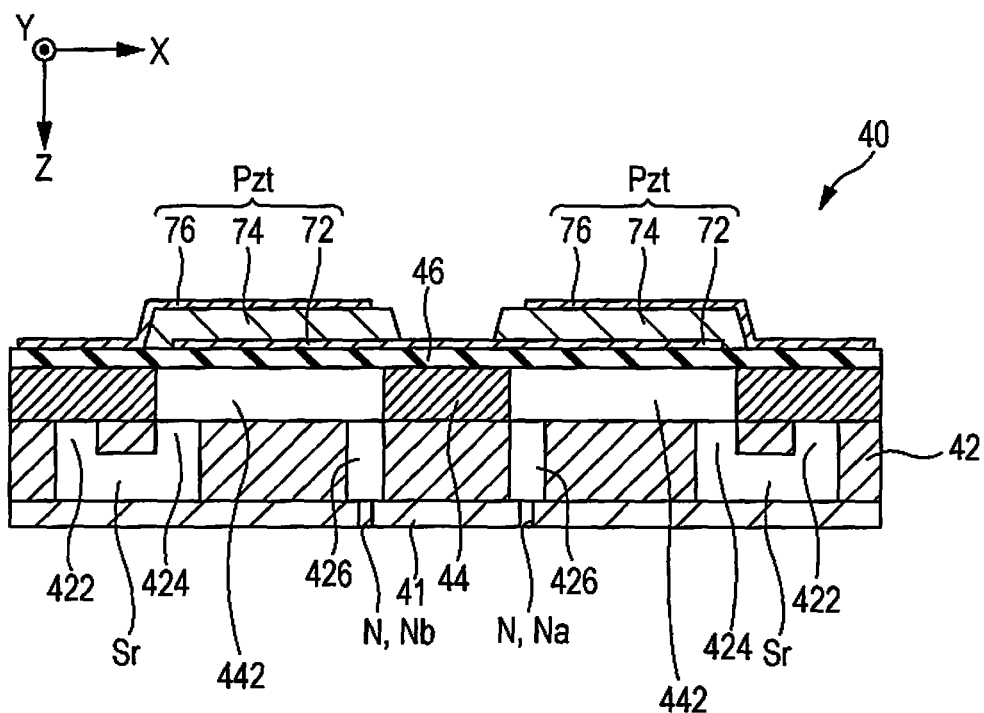
FIG. 3 is a sectional view illustrating a main configuration of the head unit.

FIG. 3 is a sectional view illustrating a structure of the actuator substrate. In detail, FIG. 3 is a view illustrating a cross section taken along line of FIG. 2B.

As illustrated in FIG. 3, the actuator substrate 40 has a structure in which a pressure chamber substrate 44 and a vibration plate 46 are provided on a surface on a negative side in the Z direction and a nozzle plate 41 is provided on a surface on a positive side in the Z direction, in a flow path substrate 42.

Schematically, each element of the actuator substrate 40 is a member of an approximately flat plate which is long in the Y direction, and is fixed to each other by for example, an adhesive or the like. In addition, the flow path substrate 42 and the pressure chamber substrate 44 are formed by, for example, a single crystal substrate of silicon.

The nozzles N are formed in the nozzle plate 41. A structure corresponding to the nozzles in the nozzle column Na is shifted from a structure corresponding to the nozzles in the nozzle column Nb by half of the pitch P1 in the Y direction, but the nozzles are formed approximately symmetrically except for that, and thus, the structure of the actuator substrate 40 will be hereinafter described by focusing on the nozzle column Na.

The flow path substrate 42 is a flat member which forms a flow path of ink, and includes an opening 422, a supply flow path 424, and a communication flow path 426. The supply flow path 424 and the communication flow path 426 are formed in each nozzle, and the opening 422 is continuously formed over the multiple nozzles and has a structure in which ink with a corresponding color is supplied. The opening 422 functions as a liquid reservoir chamber Sr, and a bottom surface of the liquid reservoir chamber Sr is configured by, for example, the nozzle plate 41. In detail, the nozzle plate 41 is fixed to the bottom surface of the flow path substrate 42 so as to close the opening 422, the supply flow path 424, and the communication flow path 426 which are in the flow path substrate 42.

The vibration plate 46 is installed on a surface on a side opposite to the flow path substrate 42, in the pressure chamber substrate 44. The vibration plate 46 is a member of an elastically vibratile flat plate, and is configured by stacking an elastic film formed of an elastic material such as a silicon oxide, and an insulating film formed of an insulating material such as a zirconium oxide. The vibration plate 46 and the flow path substrate 42 face each other with an interval in the inner side of each opening 422 of the pressure chamber substrate 44. A space between the flow path substrate 42 and the vibration plate 46 in the inner side of each opening 422 functions as a cavity 442 which provides pressure to ink. Each cavity 442 communicates with the nozzle N through the communication flow path 426 of the flow path substrate 42.

A piezoelectric element Pzt is formed in each nozzle N (cavity 442) on a surface on a side opposite to the pressure chamber substrate 44 in the vibration plate 46.

The piezoelectric element Pzt includes a common drive electrode 72 formed over the multiple piezoelectric elements Pzt formed on a surface of the vibration plate 46, a piezoelectric body 74 formed on a surface of the drive electrode 72, and individual drive electrodes 76 formed in each piezoelectric element Pzt on a surface of the piezoelectric body 74. In the configuration, a region in which the piezoelectric body 74 is interposed between the drive electrode 72 and the drive electrode 76 which face each other, functions as the piezoelectric element Pzt.

The piezoelectric body 74 is formed in a process which includes, for example, a heating process (baking). In detail, the piezoelectric body 74 is formed by baking a piezoelectric material which is applied to a surface of the vibration plate 46 on which multiple drive electrodes 72 are formed, using heating processing of a furnace, and then molding (milling by using, for example, plasma) the baked material for each piezoelectric element Pzt.

In the same manner, the piezoelectric element Pzt corresponding to the nozzle column Nb is also configured to include the drive electrode 72, the piezoelectric body 74, and the drive electrode 76.

In addition, in this example, in the piezoelectric body 74, the common drive electrode 72 is used as a lower layer and the individual drive electrodes 76 are used as an upper layer, but in contrast to this, a configuration in which the common drive electrode 72 is used as an upper layer and the individual drive electrodes 76 are used as a lower layer, may be provided.

A configuration may be provided in which the drive IC is directly mounted in the actuator substrate 40.

As will be described below, meanwhile a voltage Vout of a drive signal according to the amount of ink to be ejected is individually applied to the drive electrode 76 which is a terminal of the piezoelectric element Pzt, a retention signal of a voltage $V_{BS}$ is commonly applied to the drive electrode 72 which is the other terminal of the piezoelectric element Pzt.

Accordingly, the piezoelectric element Pzt becomes displaced upwardly or downwardly in accordance with a voltage which is applied to the drive electrodes 72 and 76. In detail, if the voltage Vout of the drive signal which is applied through the drive electrode 76 decreases, the central portion of the piezoelectric element Pzt is bent upwardly with respect to both end portions, and meanwhile, if the voltage Vout increases, the central portion of the piezoelectric element Pzt is bent downwardly.

If the central portion is bent upwardly, an internal volume of the cavity 442 increases (pressure decreases), and thus ink is drawn from the liquid reservoir chamber Sr. Meanwhile, if the central portion is bent downwardly, an internal volume of the cavity 442 decreases (pressure increases), and thus, an ink droplet is ejected from the nozzle N in accordance with the decreased degree. In this way, if a proper drive signal is applied to the piezoelectric element Pzt, ink is ejected from the nozzle N in accordance with the displacement of the piezoelectric element Pzt. Accordingly, an ejecting unit which ejects ink in accordance with at least the piezoelectric element Pzt, the cavity 442, or the nozzle N, is configured.

Next, an electrical configuration of the printing apparatus 1 will be described.

Figure 4:
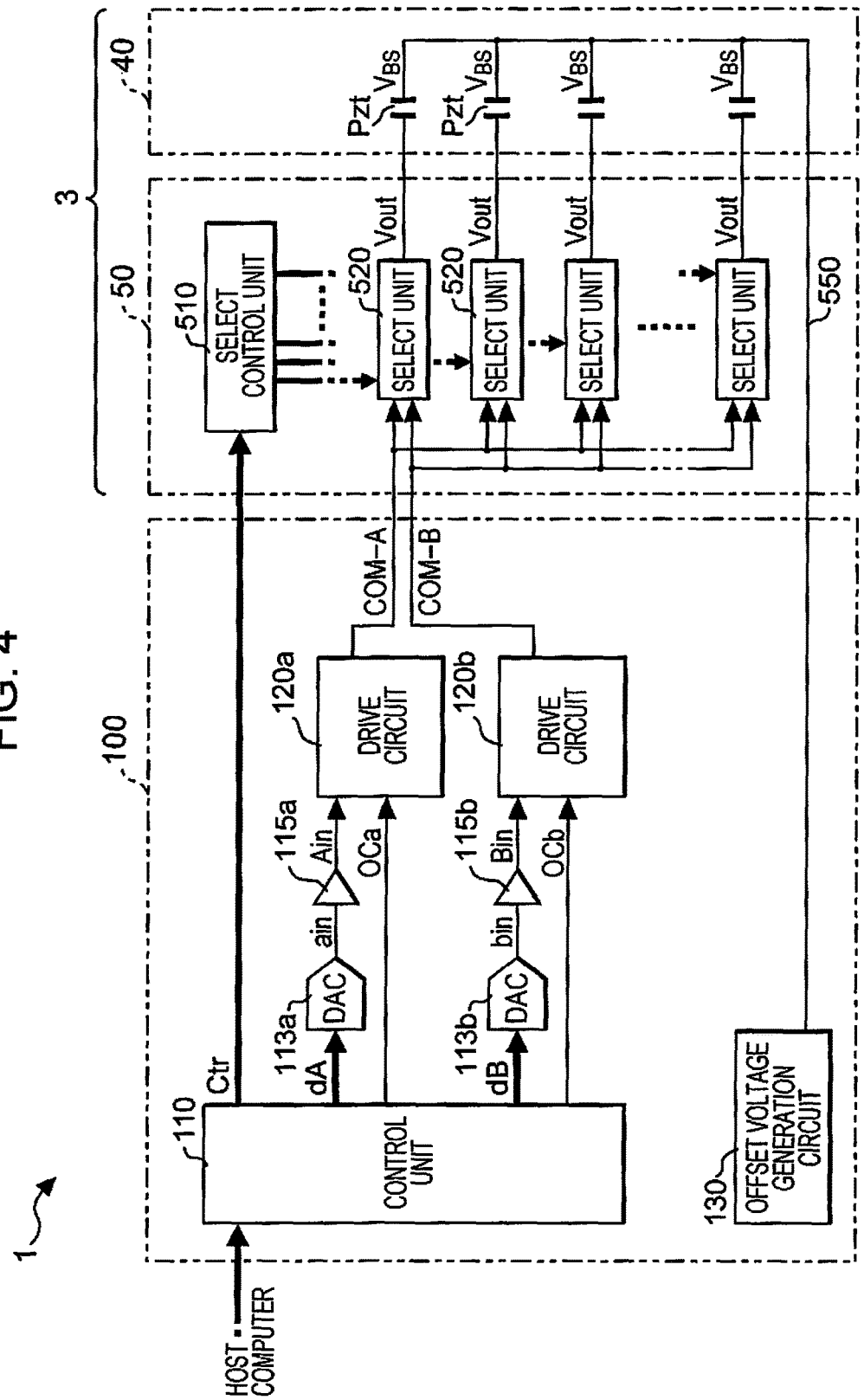
FIG. 4 is a block diagram illustrating an electrical configuration of the printing apparatus (Example 1).

FIG. 4 is a block diagram illustrating an electrical configuration of the printing apparatus 1.

As illustrated in FIG. 4, the printing apparatus 1 has a configuration in which the head unit 3 is coupled to a main substrate 100. The head unit 3 is largely divided into the actuator substrate 40 and a drive IC 50.

The main substrate 100 supplies a control signal Ctr or drive signals COM-A and COM-B to the drive IC 50, and supplies a retention signal of the voltage $V_{BS}$ (offset voltage) to the actuator substrate 40 through a wire 550.

In the printing apparatus 1, four head units 3 are provided, and the main substrate 100 independently controls the four head units 3. The four head units 3 are the same as each other except that the colors of ink to be ejected are different from each other, and thus, hereinafter, one head unit 3 will be representatively described for the sake of convenience.

As illustrated in FIG. 4, the main substrate 100 includes a control unit 110, D/A converters (DAC) 113a and 113b, voltage amplifiers 115a and 115b, drive circuits 120a and 120b, and an offset voltage generation circuit 130.

Among these, the control unit 110 is a type of a microcontroller having a CPU, a RAM, a ROM, and the like, and outputs various control signals or the like for controlling each unit by executing a predetermined program, when image data which becomes a printing target is supplied from a host computer or the like.

In detail, first, the control unit 110 repeatedly supplies digital data dA to the DAC 113a and the drive circuit 120a, and repeatedly supplies digital data dB to the DAC 113b and the drive circuit 120b, in the same manner. Here, the data dA defines a waveform of the drive signal COM-A which is supplied to the head unit 3, and the data dB defines a waveform of the drive signal COM-B.

The DAC 113a converts the digital data dA into analog signal ain. The voltage amplifier 115a amplifies a voltage of the signal ain by, for example, 10 times and supplies the voltage to the drive circuit 120a as a signal Ain. In the same manner, the DAC 113b converts the digital data dB into analog signal bin, and the voltage amplifier 115b amplifies a voltage of the signal bin by, for example, 10 times and supplies the voltage to the drive circuit 120b as a signal Bin.

The drive circuit 120a, which will be described below in detail, outputs the signal Ain to the piezoelectric element Pzt which is a capacitive load as the drive signal COM-A by increasing drive capability (converting to low impedance). In the same manner, the drive circuit 120b outputs the signal Bin as the drive signal COM-B by increasing drive capability.

The drive signal COM-A and COM-B (signals ain and bin after being analog-converted, signals Ain and Bin before being impedance-converted) have trapezoidal waveforms as will be described below.

The signal Ain (Bin) which is converted by the DAC 113a (113b) performs a relatively small swing in a range of a voltage of, for example, approximately 0 V to 4 V, and in contrast to this, the drive signal COM-A (COM-B) performs a relatively large swing in a range of a voltage of, for example, approximately 0 V to 40 V. Accordingly, there is provided a configuration in which the voltage amplifier 115a (115b) amplifies a voltage of the signal ain (bin) which is converted by the DAC 113a (113b), and the drive circuit 120a (120b) impedance-converts the signal Ain (Bin) whose voltage is amplified.

Second, the control unit 110 supplies various control signals Ctr to the head unit 3, in synchronization with control for the moving mechanism 6 and the transport mechanism 8. The control signals Ctr which are supplied to the head unit 3 include print data (ejecting control signal) which defines the amount of ink which is ejected from the nozzle N, a clock signal which is used for transmission of the print data, a timing signal which defines a print period or the like, or the like.

The control unit 110 controls the moving mechanism 6 and the transport mechanism 8, but such a configuration is known, and thus, description thereof will be omitted.

The offset voltage generation circuit 130 in the main substrate 100 generates a retention signal of the voltage $V_{BS}$ and commonly applies the signal to the other terminals of the multiple piezoelectric elements Pzt in the actuator substrate 40 through the wires 550. The retention signal of the voltage $V_{BS}$ maintains the other terminals of the multiple piezoelectric elements Pzt in a constant state.

Meanwhile, in the head unit 3, the drive IC 50 includes a select control unit 510 and select units 520 which correspond to the piezoelectric elements Pzt one to one. The select control unit 510 controls selection of each of the select units 520. In detail, the select control unit 510 stores the print data which is supplied in correspondence with a clock signal from the control unit 110 in several nozzles (piezoelectric elements Pzt) of the head unit 3 once, and instructs each select unit 520 to select the drive signals COM-A and COM-B in accordance with the print data at a start timing of a print period which is defined by a timing signal.

Each select unit 520 selects (or does not select any one) one of the drive signals COM-A and COM-B in accordance with instruction of the select control unit 510, and applies the selected signal to one terminal of the corresponding piezoelectric element Pzt as a drive signal of the voltage Vout.

As described above, one piezoelectric element Pzt is provided in each nozzle N in the actuator substrate 40. The other terminals of each piezoelectric element Pzt are coupled in common, and the voltage $V_{BS}$ from the offset voltage generation circuit 130 is applied to the other terminals through the wire 550.

In the present embodiment, ink is ejected from one nozzle N maximum twice by one dot, and thus four gradations of a large dot, a medium dot, a small dot, and no record are represented. In the present embodiment, in order to represent the four gradations, two types of the drive signals COM-A and COM-B are prepared, and each period has first half pattern and a second half pattern. Then, during one period, the drive signals COM-A and COM-B are selected (or not selected) in accordance with a gradation to be represented in the first half and a second half, and the selected signal is supplied to the piezoelectric element Pzt.

Thus, the drive signals COM-A and COM-B will be first described, and thereafter, a detailed configuration of the select control unit 510 for selecting the drive signals COM-A and COM-B, and the select unit 520 will be described.

Figure 5:
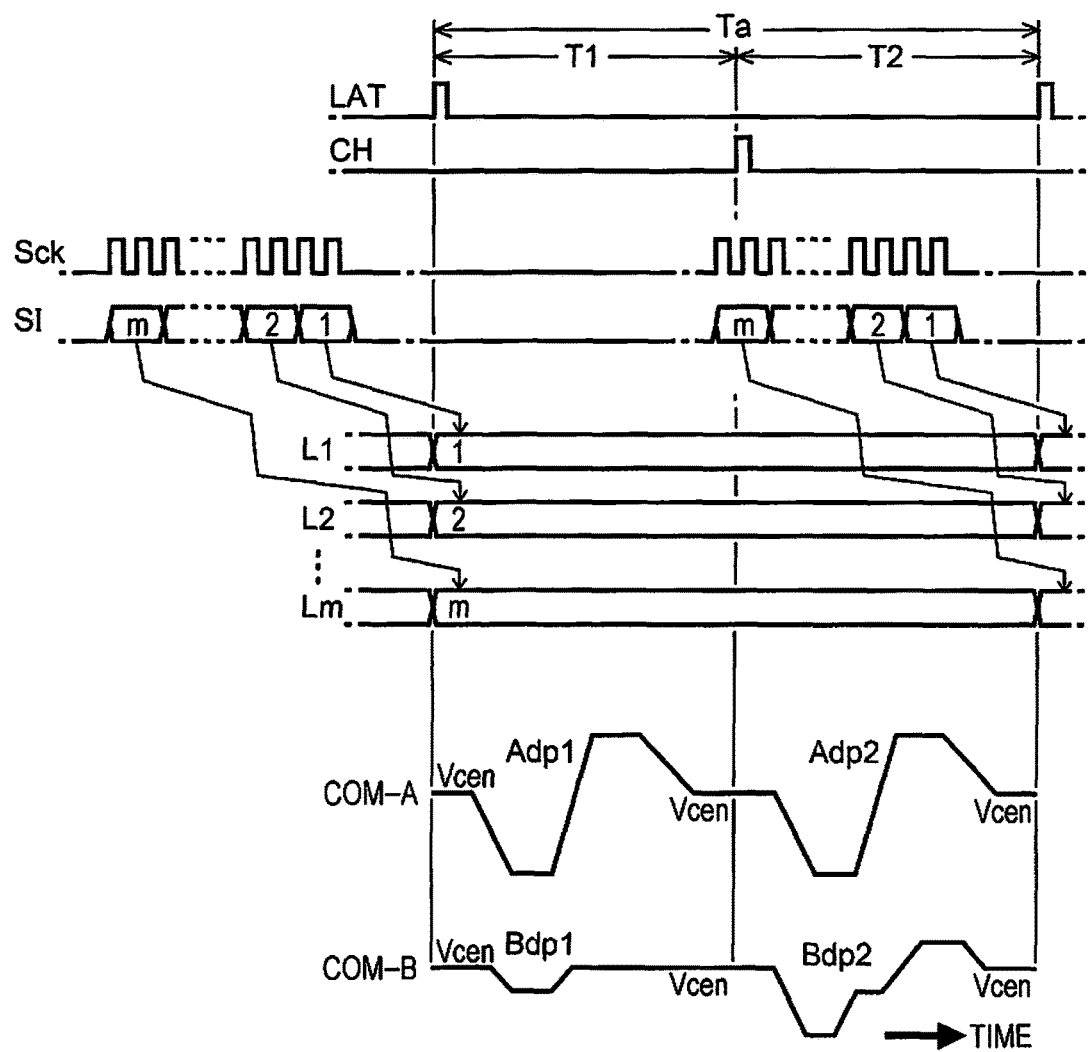
FIG. 5 is a diagram illustrating waveforms and the like of drive signals.

FIG. 5 is a diagram illustrating waveforms or the like of drive signals COM-A and COM-B.

As illustrated in FIG. 5, the drive signal COM-A is configured by a repeated waveform of a trapezoidal waveform Adp1 which is disposed during a period T1 from time when a control signal LAT is output (rises) to time when a control signal CH is output, during a print period Ta, and a trapezoidal waveform Adp2 which is disposed during a period T2 from time when the control signal CH is output and to the control signal LAT is output during the print period Ta.

In the present embodiment, the trapezoidal waveforms Adp1 and Adp2 are approximately the same waveforms as each other, and are waveforms which eject ink of a predetermined amount, specifically, an approximately medium amount from the nozzle N corresponding to the piezoelectric elements Pzt, if each waveform is supplied to the drive electrode 76 which is one terminal of the piezoelectric elements Pzt.

The drive signal COM-B is configured by a repeated waveform of a trapezoidal waveform Bdp1 which is disposed during the period T1 and a trapezoidal waveform Bdp2 which is disposed during the period T2. In the present embodiment, the trapezoidal waveforms Bdp1 and Bdp2 are waveforms different form each other. Among these, the trapezoidal waveform Bdp1 is a waveform for preventing an increase of viscosity of ink by slightly vibrating the ink near the nozzle N. Accordingly, even if the trapezoidal waveform Bdp1 is supplied to the one terminal of the piezoelectric element Pzt, ink is not ejected from the nozzle N corresponding to the piezoelectric element Pzt. In addition, the trapezoidal waveform Bdp2 is a waveform different from the trapezoidal waveform Adp1 (Adp2). If the trapezoidal waveform Bdp2 is supplied to the one terminal of the piezoelectric element Pzt, the trapezoidal waveform Bdp2 becomes a waveform which ejects the amount of ink less than the predetermined amount from the nozzle N corresponding to the piezoelectric element Pzt.

Voltages at a start timing of the trapezoidal waveforms Adp1, Adp2, Bdp1, and Bdp2, and voltages at an end timing of the trapezoidal waveforms Adp1, Adp2, Bdp1, and Bdp2 are all common at a voltage Vcen. That is, the trapezoidal waveforms Adp1, Adp2, Bdp1, and Bdp2 are waveforms which respectively start at the voltage Vcen and ends at the voltage Vcen.

In the present example, since the drive circuit 120a (120b) impedance-converts the signal Ain (Bin), a waveform of the signal Ain (Bin) which is input has some errors, but a waveform of the drive signal COM-A (COM-B) is maintained as it is. Meanwhile, since the signal Ain (Bin) is obtained by amplifying a voltage of the signal ain (bin) by 10 times, the waveform of the signal ain (bin) is 1/10 of the signal Ain (Bin). Since the signal ain (bin) is obtained by analog-converting the data dA (dB), a voltage waveform of the drive signal COM-A (COM-B) is defined by the control unit 110.

The control unit 110 outputs a signal OCa (select signal) having the following logic level with respect to the trapezoidal waveform of the drive signal COM-A (COM-B) to the drive circuit 120a. In detail, the control unit 110 causes the signal OCa to be in a High (H) level during a period in which a voltage of the drive signal COM-A (signal Ain) decreases and a period in which the drive signal COM-A is constant at a voltage lower than a threshold value Vth1, and other than that, to be in a Low (L) level during a period in which the voltage of the drive signal COM-A increases and a period in which the drive signal COM-A is constant at a voltage higher than the threshold value Vth1.

In the present example, when a maximum value of the voltage of the drive signal COM-A (signal Ain) is referred to as max and a minimum value thereof is referred to as min, description will be made by assuming that a relationship of max>Vth1>Vcen>min is satisfied for the sake of convenient. The relationship may be max>Vcen>Vth1>min. An example of the signal OCa will be described below.

In the same manner, the control unit 110 outputs a signal OCb having the following logic level with respect to the trapezoidal waveform of the drive signal COM-B to the drive circuit 120b. In detail, the control unit 110 causes the signal OCb to be in a H level during a period in which a voltage of the drive signal COM-B (signal Bin) decreases and a period in which the drive signal COM-B is constant at a voltage lower than the threshold value Vth1, and other than that, to be in a L level during a period in which the voltage of the drive signal COM-B increases and a period in which the drive signal COM-B is constant at a voltage higher than or equal to the threshold value Vth1.

Figure 6:
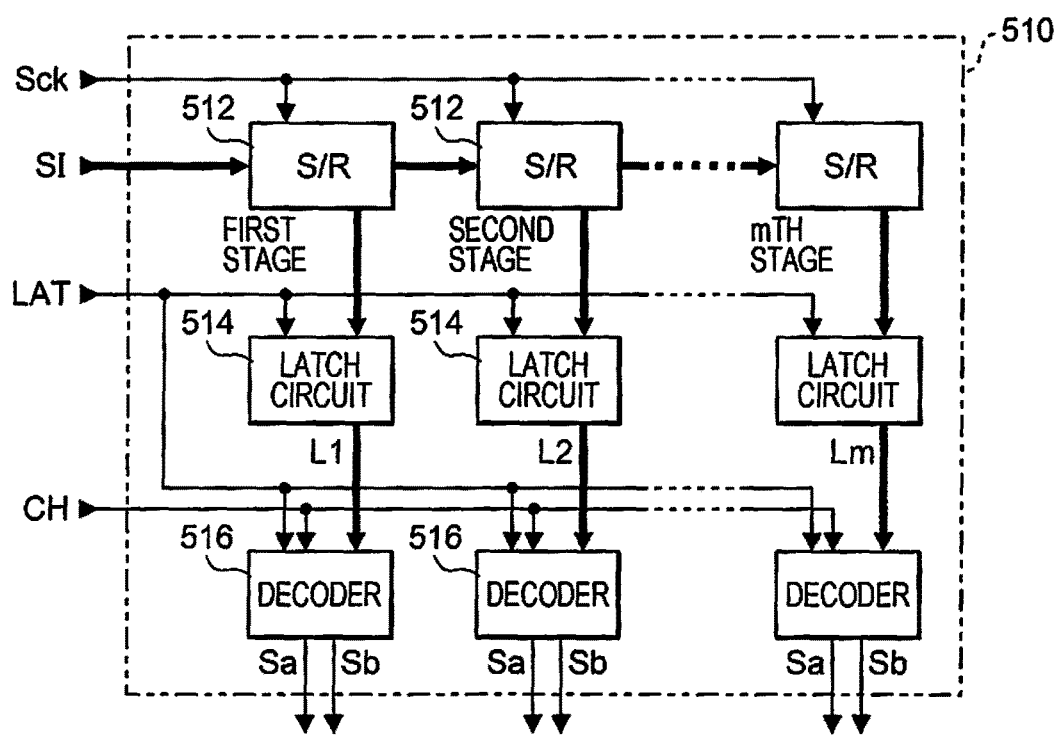
FIG. 6 is a diagram illustrating a configuration of a select control unit.

FIG. 6 is a diagram illustrating a configuration of the select control unit 510 of FIG. 4.

As illustrated in FIG. 6, a clock signal Sck, the print data SI, and the control signals LAT and CH are supplied to the select control unit 510. Multiple sets of a shift register (S/R) 512, a latch circuit 514, and a decoder 516 are provided in correspondence with each of the piezoelectric elements Pzt (nozzles N) in the select control unit 510.

The print data SI is data which defines dots to be formed by all the nozzles N in the head unit 3 which is focused during the print period Ta. In the present embodiment, in order to represent the four gradations of no record, a small dot, a medium dot, and a large dot, the print data for one nozzle is configured by two bits of a most significant bit (MSB) and a least significant bit (LSB).

The print data SI is supplied in accordance with transport of the medium P for each nozzle N (piezoelectric element Pzt) in synchronization with the clock signal Sck. The shift register 512 has a configuration in which the print data SI of two bits is retained once in correspondence with the nozzle N.

In detail, shift registers 512 of total m stages corresponding to each of m piezoelectric elements Pzt (nozzles) are coupled in cascade, and the print data SI which is supplied to the shift register 512 of a first stage located at a left end of FIG. 6 is sequentially transmitted to the rear stage (downstream side) in accordance with the clock signal Sck.

In FIG. 6, in order to separate the shift registers 512, the shift register 512 are sequentially referred to as a first stage, a second stage, . . . , an mth stage from the upstream side to which the print data SI is supplied.

The latch circuit 514 latches the print data SI retained in the shift register 512 at a rising edge of the control signal LAT.

The decoder 516 decodes the print data SI of two bits which are latched in the latch circuit 514, outputs select signals Sa and Sb for each of periods T1 and T2 which are defined by the control signal LAT and the control signal CH, and defines selection of the select unit 520.

Figures 7, 8:
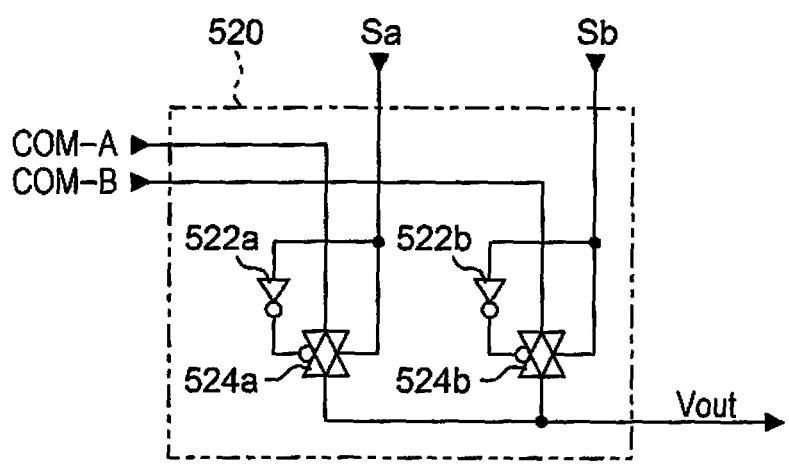
FIG. 7 is a diagram illustrating decoded content of a decoder.
FIG. 8 is a diagram illustrating a configuration of a select unit.

FIG. 7 is a diagram illustrating decoded content of the decoder 516.

In FIG. 7, the print data SI of two bits which are latched is referred to as an MSB and an LSB. In the decoder 516, if the latched print data SI is (0,1), it means that logic levels of the select signals Sa and Sb are respectively output as levels of H and L during the period T1, and levels of L and H during the period T2.

The logic levels of the select signals Sa and Sb are level-shifted by a level shifter (not illustrated) to a higher amplitude logic than the logic levels of the clock signal Sck, the print data SI, and the control signals LAT and CH.

FIG. 8 is a diagram illustrating a configuration of the select unit 520 of FIG. 4.

As illustrated in FIG. 8, the select unit 520 includes inverters (NOT circuit) 522a and 522b, and transfer gates 524a and 524b.

The select signal Sa from the decoder 516 is supplied to a positive control terminal to which a round mark is not attached in the transfer gate 524a, is logically inverted by the inverter 522a, and is supplied to a negative control terminal to which a round mark is attached in the transfer gate 524a. In the same manner, the select signal Sb is supplied to a positive control terminal of the transfer gate 524b, is logically inverted by the inverter 522b, and is supplied to a negative control terminal of the transfer gate 524b.

The drive signal COM-A is supplied to an input terminal of the transfer gate 524a, and the drive signal COM-B is supplied to an input terminal of the transfer gate 524b. The output terminals of the transfer gates 524a and 524b are coupled to each other, and are coupled to one terminal of the corresponding piezoelectric element Pzt.

If the select signal Sa is in a H level, the input terminal and the output terminal of the transfer gate 524a are electrically coupled (ON) to each other. If the select signal Sa is in a L level, the input terminal and the output terminal of the transfer gate 524a are electrically decoupled (OFF) from each other. In the same manner, the input terminal and the output terminal of the transfer gate 524b are also electrically coupled to each other or decoupled from each other in accordance with the select signal Sb.

As illustrated in FIG. 5, the print data SI is supplied to each nozzle in synchronization with the clock signal Sck, and is sequentially transmitted to the shift registers 512 corresponding to the nozzles. Thus, if supply of the clock signal Sck is stopped, the print data SI corresponding to each nozzle is retained in each of the shift registers 512.

If the control signal LAT rises, each of the latch circuits 514 latches all of the print data SI retained in the shift registers 512. In FIG. 5, the number in L1, L2, . . . , Lm indicate the print data SI which is latched by the latch circuits 514 corresponding to the shift registers 512 of the first stage, the second stage, . . . , the mth stage.

The decoder 516 outputs the logic levels of the select signals Sa and Sb in the content illustrated in FIG. 7 in accordance with the size of the dots which are defined by the latched print data SI during the periods T1 and T2.

That is, first, the decoder 516 sets the select signals Sa and Sb to levels of H and L during the period T1 and levels of H and L even during the period T2, if the print data SI is (1,1) and the size of the large dot is defined. Second, the decoder 516 sets the select signals Sa and Sb to levels of H and L during the period T1 and levels of L and H during the period T2, if the print data SI is (0,1) and the size of the medium dot is defined. Third, the decoder 516 sets the select signals Sa and Sb to levels of L and L during the period T1 and levels of L and H during the period T2, if the print data SI is (1,0) and the size of the small dot is defined. Fourth, the decoder 516 sets the select signals Sa and Sb to levels of L and H during the period T1 and levels of L and L during the period T2, if the print data SI is (0,0) and no recode is defined.

Figure 9:
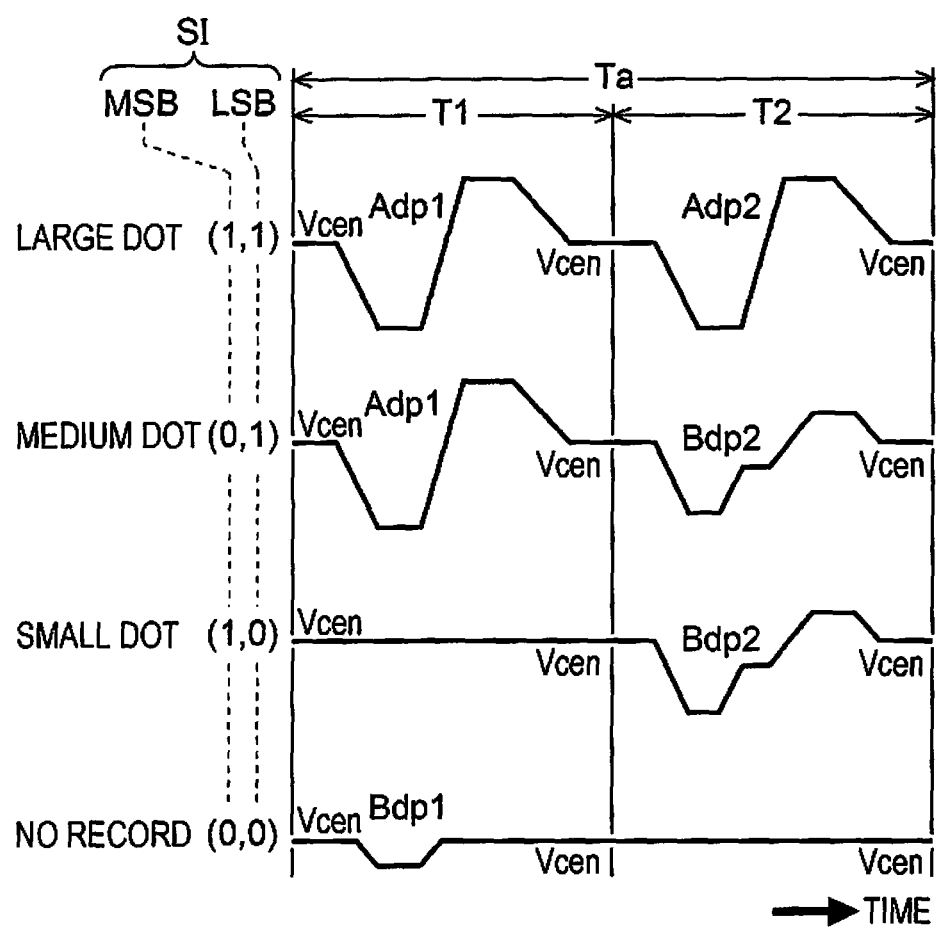
FIG. 9 is a diagram illustrating the drive signals which are supplied from the select unit to a piezoelectric element.

FIG. 9 is a diagram illustrating waveforms of the drive signals which are selected in accordance with the print data SI and are supplied to one terminal of the piezoelectric element Pzt.

When the print data SI is (1,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Since the select signals Sa and Sb are in H and L levels even during the period T2, the select unit 520 selects the trapezoidal waveform Adp2 of the drive signal COM-A.

In this way, if the trapezoidal waveform Adp1 is selected during the period T1, the trapezoidal waveform Adp2 is selected during the period T2, and the selected waveforms are supplied to one terminal of the piezoelectric element Pzt as drive signals, ink of an approximately medium amount is ejected twice from the nozzle N corresponding to the piezoelectric element Pzt. Accordingly, each ink is landed on and combined with the medium P, and as a result, a large dot is formed as defined by the print data SI.

When the print data SI is (0,1), the select signals Sa and Sb become H and L levels during the period T1, and thus the transfer gate 524a is turned on, and the transfer gate 524b is turned off. Accordingly, the trapezoidal waveform Adp1 of the drive signal COM-A is selected during the period T1. Next, since the select signals Sa and Sb are in L and H levels during the period T2, the trapezoidal waveform Bdp2 of the drive signal COM-B is selected.

Hence, ink of an approximately medium amount and an approximately small amount is ejected twice from the nozzle N. Accordingly, each ink is landed on and combined with the medium P, and as a result, a medium dot is formed as defined by the print data SI.

When the print data SI is (1,0), the select signals Sa and Sb become all L levels during the period T1, and thus the transfer gates 524a and 524b are turned off.

Accordingly, the trapezoidal waveforms Adp1 and Bdp1 are not selected during the period T1. If the transfer gates 524a and 524b are all turned off, a path from a coupling point of the output terminals of the transfer gates 524a and 524b to one terminal of the piezoelectric element Pzt becomes a high impedance state in which the path is not electrically coupled to any portion. However, both terminals of the piezoelectric element Pzt retain a voltage (Vcen−$V_{BS}$) shortly before the transfer gates are turned off, by capacitance included in the piezoelectric element Pzt itself.

Next, since the select signals Sa and Sb are in L and H levels during the period T2, the trapezoidal waveform Bdp2 of the drive signal COM-B is selected. Accordingly, ink of an approximately small amount is ejected from the nozzle N only during the period T2, and thus small dot is formed on the medium P as defined by the print data SI.

When the print data SI is (0,0), the select signals Sa and Sb become L and H levels during the period T1, and thus the transfer gates 524a is turned off and the transfer gate 524b is turned on. Accordingly, the trapezoidal waveforms Bdp1 of the drive signal COM-B is selected during the period T1. Next, since all of the select signals Sa and Sb are in L levels during the period T2, the trapezoidal waveforms Adp2 and Bdp2 are all not selected.

Accordingly, ink near the nozzle N just slightly vibrates during the period T1, and the ink is not ejected, and thus, as a result, dots are not formed, that is, no record is made as defined by the print data SI.

In this way, the select unit 520 selects (or does not select) the drive signals COM-A and COM-B in accordance with instruction of the select control unit 510, and applies the selected signal to one terminal of the piezoelectric element Pzt. Accordingly, each of the piezoelectric elements Pzt is driven in accordance with the size of the dot which is defined by the print data SI.

The drive signals COM-A and COM-B illustrated in FIG. 5 are just an example. Actually, combinations of various waveforms which are prepared in advance are used in accordance with properties, transport speed, or the like of the medium P.

In addition, here, an example in which the piezoelectric element Pzt is bent upwardly in accordance with a decrease of a voltage is used, but if a voltage which is applied to the drive electrodes 72 and 76 is inverted, the piezoelectric element Pzt is bent downwardly in accordance with a decrease of the voltage. Accordingly, in a configuration in which the piezoelectric element Pzt is bent downwardly in accordance with a decrease of a voltage, the drive signals COM-A and COM-B illustrated in the figure have waveforms which are inverted by using the voltage Vcen as a reference.

Next, the drive circuit 120a and 120b of the main substrate 100 will be described.

In relation to symbols of the drive circuits, a symbol of a side on which the drive signal COM-A is output is unified as 120a, and a symbol of a side on which the drive signal COM-B is output is unified as 120b, but since there are several aspects as will be describe below, there is a case where parenthesis such as a drive circuit (Example 1) or a drive circuit (Example 2) is attached for distinguishment instead of a symbol in the same manner as in the printing apparatus.

Hence, in relation to the drive circuit (Example 1), the drive circuit 120a on a side on which the drive signal COM-A (COM-B) is output will be first described as an example.

Figure 10:
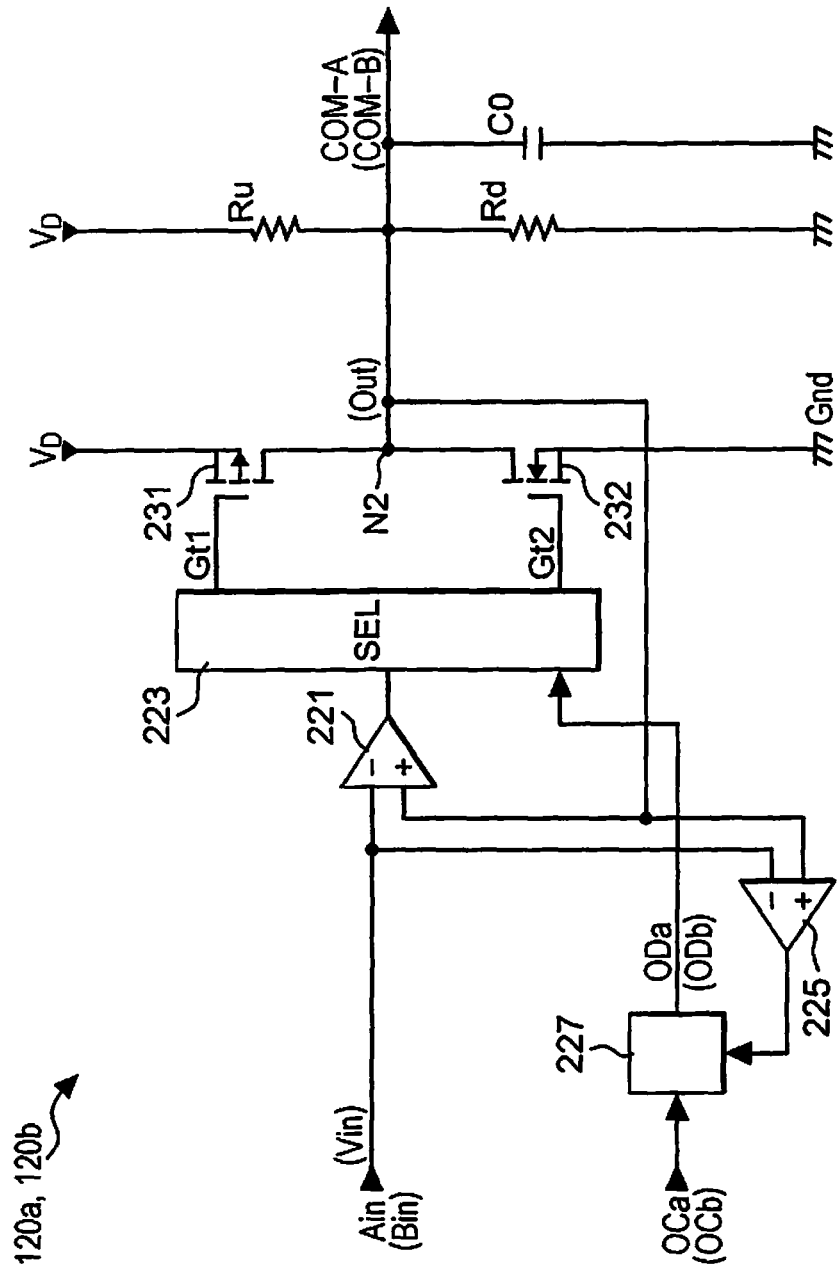
FIG. 10 is a diagram illustrating a drive circuit (Example 1) which is applied to the printing apparatus (Example 1).

FIG. 10 is a diagram illustrating the drive circuit (Example 1). As illustrated in this figure, the drive circuit 120a includes differential amplifiers 221 and 225, a selector 223, a pulse inserter 227, transistors 231 and 232, resistance elements Ru and Rd, and a capacitor C0.

A voltage of the signal Ain which is an input of the drive circuit 120a is referred to as Vin, and a voltage of the node N2 which is an output is referred to as Out.

A negative input terminal (−) of the differential amplifier 221 receives the signal Ain, and the drive signal COM-A which is an output is fed back to a positive input terminal (+) of the differential amplifier 221. Accordingly, the differential amplifier 221 outputs a difference voltage which is obtained by subtracting a voltage of the negative input terminal (−) from a voltage of the positive input terminal (+), that is, a difference voltage which is obtained by subtracting a voltage Vin of the signal Ain (source drive signal) with a large amplitude that is an input from a voltage Out, which will be described below, of the drive signal COM-A which is an output, and outputs the amplified voltage.

However, for example, the differential amplifier 221 uses a high potential side of a power supply as a voltage $V_D$, and uses a low potential side thereof as a ground Gnd, while not particularly illustrated. Accordingly, an output voltage is within a range from the ground Gnd to the voltage $V_D$.

There a case where an output signal of the differential amplifier 221 is also used as a signal for a switching operation which will be described below, but is also used as a signal for a linear operation. In a case where the output signal is used as the signal for the switching operation, a H level indicates the voltage $V_D$, and a L level indicates the ground Gnd of a zero voltage. In addition, since the output signal of the differential amplifier 221 controls switching operations and linear operations of transistors 231 and 232 after all as will be described below, the output signal can be said to be a control signal for the transistors.

There is also a case where a voltage of a drive signal is decreased and fed back and a source drive signal is voltage-amplified to output as the drive signal, and thus, it may be said that a signal based on the drive signal is fed back to the differential amplifier 221.

In the same manner as the differential amplifier 221, a negative input terminal (−) of the differential amplifier 225 receives the signal Ain, and the drive signal COM-A which is an output feeds back to a positive input terminal (+) of the differential amplifier 225. However, a high-side power supply voltage of the differential amplifier 225 is voltage $V_D$ in common, but a low-side power supply voltage thereof is, for example, a voltage $-V_D$ lower than the ground Gnd. Accordingly, the differential amplifier 225 outputs a difference voltage which is obtained by subtracting the voltage Vin from the voltage Out as a positive voltage higher than the ground Gnd if the voltage Out of the drive signal COM-A is higher than the voltage Vin of the signal Ain, and outputs the difference voltage as a negative voltage lower than the ground Gnd if the voltage Out is lower than the voltage Vin.

Anyway, a voltage of a signal which is output from the differential amplifier 225 indicates a difference between the voltage Vin and the voltage Out, in view of an absolute value which uses the ground Gnd as a reference.

If the voltage of the signal which is output from the differential amplifier 225 is higher than or equal to a threshold value Vth2 as an absolute value, the pulse inserter 227 inverts a logic level of the signal OCa at the time for a predetermined time to output as a signal ODa. That is, if a difference between the voltage Vin and the voltage Out is higher than or equal to the threshold value Vth2 as an absolute value, the pulse inserter 227 inserts a pulse into the signal OCa to output as the signal ODa.

If the signal ODa is in a L level, the selector (select unit) 223 selects the output signal of the differential amplifier 221 as a signal Gt1, supplies the selected signal to a gate terminal of a transistor 231, selects a L level as a signal Gt2, and supplies the selected L level to a gate terminal of a transistor 232. Meanwhile, if the signal ODa is in a H level, the selector 223 selects a H level as the signal Gt1, supplies the selected H level to the gate terminal of the transistor 231, selects the output signal of the differential amplifier 221 as the signal Gt2, and supplies the selected output signal to the gate terminal of the transistor 232.

In other words, there is provided a configuration in which, if the signal ODa is in a L level, the selector 223 selects the transistor 231 and supplies a difference signal which is the output signal of the differential amplifier 221 to the gate terminal of the transistor 231, and if the signal ODa is in a H level, the selector 223 selects the transistor 232, supplies the difference signal to the gate terminal of the transistor 232, and supplies a signal which turns off the transistor to the gate terminal of the unselected transistor as will be described below.

The pair of transistors are configured by transistors 231 and 232. The transistor 231 (high-side transistor) on a high side of these is, for example, a P-channel field effect transistor, and a high-side voltage $V_D$ is applied to a source terminal thereof. The transistor 232 (low-side transistor) on a low side is, for example, an N-channel field effect transistor, and a source terminal thereof is coupled to the ground Gnd which is a low side of the power supply.

Drain terminals of the transistors 231 and 232 are coupled to each other, and become a node N2 which is the output terminal of the drive circuit 120a. That is, the drive signal COM-A is configured to output from the node N2.

The node N2 is coupled to the positive input terminal (+) of the differential amplifier 221, and voltage of the node is pulled up to the voltage $V_D$ through the resistance element Ru (first resistance element), while being pulled down to the ground through the resistance element Rd (second resistance element). In addition, the capacitor C0 (output capacitor) is provided to prevent abnormal oscillation from occurring, one terminal thereof is coupled to the node N2, and the other terminal thereof is coupled to a constant potential, for example, the ground Gnd.

Here, the drive circuit 120a which outputs the drive signal COM-A will be described, but a configuration of the drive circuit 120b which outputs the drive signal COM-B is the same as the configuration of the drive circuit 120a, and only the input and output signals are different from each other. That is, in the drive circuit 120b which is denoted by a parenthesis of FIG. 10, the negative input terminal (−) of the differential amplifier 221 receives the signal Bin and the selector 223 receives the signal OCb, while the drive signal COM-B is output from the node N2.

Next, a configuration of a drive circuit according to a comparative example will be described before an operations of the drive circuits 120a and 120b will be described.

Figure 17:
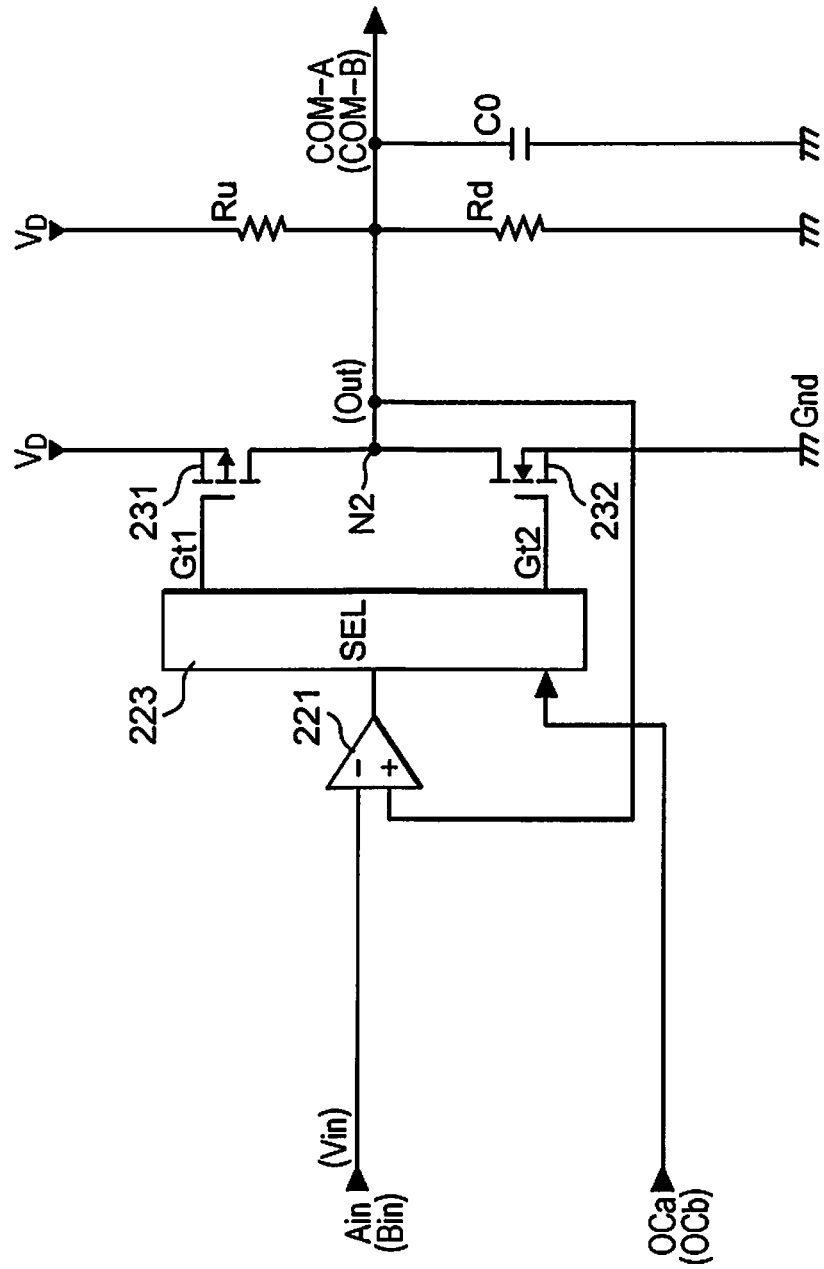
FIG. 17 is a block diagram illustrating a drive circuit (comparative example).

FIG. 17 is a diagram illustrating the configuration of the drive circuit according to the comparative example. A difference between the drive circuit (comparative example) illustrated in this figure and the drive circuit (Example 1) illustrated in FIG. 10 is that the drive circuit (comparative example) does not include the differential amplifier 225 and the pulse inserter 227 and the signal OCa (OCb) is directly coupled to the selector 223.

An operation of the drive circuit (comparative example) will be described by using a side from which the drive signal COM-A is output as an example.

Figure 18:
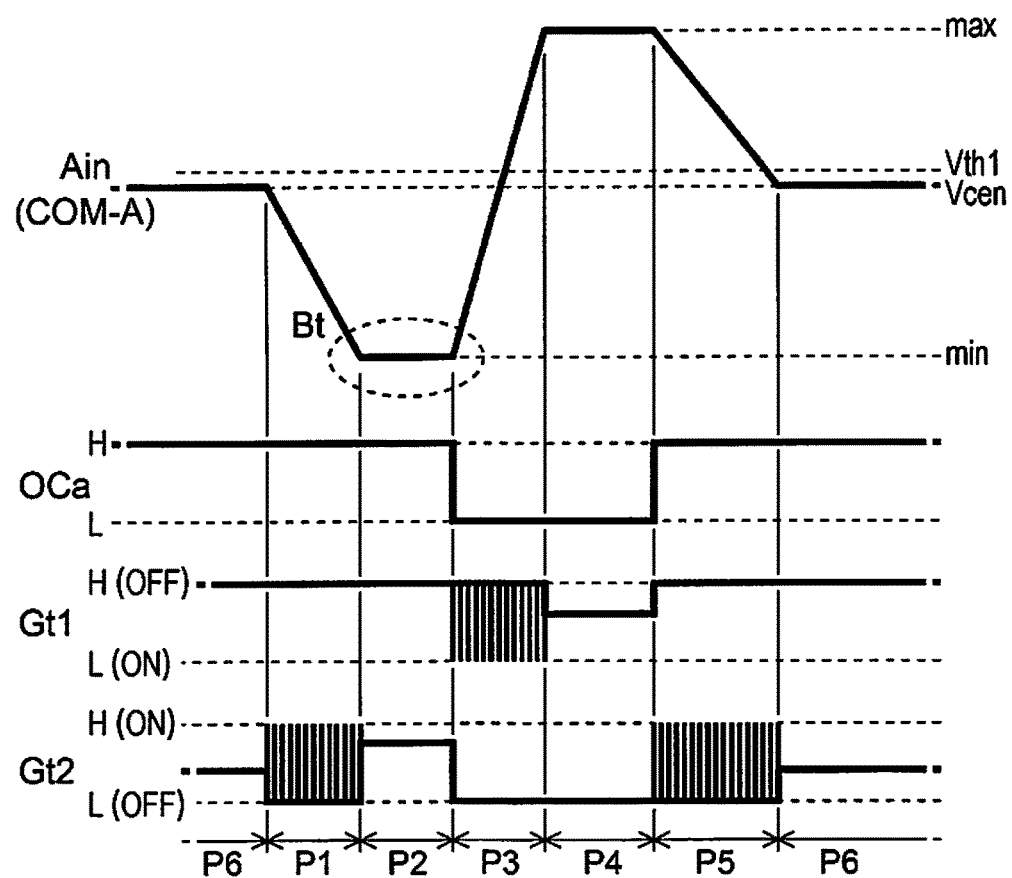
FIG. 18 is a diagram illustrating an operation of the drive circuit (comparative example).

FIG. 18 is a diagram illustrating the operation of the drive circuit (comparative example).

In this figure, the signal Ain is a signal into which the drive signal COM-A is not impedance-converted, thus, thereby, having approximately the same waveform as the drive signal COM-A. In addition, as described above, the drive signal COM-A has a waveform in which two trapezoidal waveforms Adp1 and Adp2 which are the same are repeated during a print period Ta, and thus, the signal Ain also has the same waveform which is repeated.

FIG. 18 illustrates one trapezoidal waveform of the repeating waveforms. In addition, in the figure, a period P1 is a period in which the voltage Vin of the signal Ain decreases from the voltage Vcen to the minimum value min, a period P2 subsequent to the period P1 is a period in which the voltage Vin is constant at the minimum value min, a period P3 subsequent to the period P2 is a period in which the voltage Vin increases from the minimum value min to the maximum value, a period P4 subsequent to the period P3 is a period in which the voltage Vin is constant at the maximum value max, and a period P5 subsequent to the period P4 is a period in which the voltage Vin decreases from the maximum value max to the voltage Vcen.

A vertical scale denoting a voltage with respect to each voltage waveform of FIG. 18 is not necessarily assigned for the sake of convenient description.

First, the period P1 is a voltage decrease period of the drive signal COM-A (Ain). Accordingly, since the signal OCa is in a H level during the period P1, the selector 223 selects a H level as the signal Gt1, and selects the output signal of the differential amplifier 221 as the signal Gt2.

Since the signal Gt1 is in a H level during the period P1, the P-channel transistor 231 is turned off.

Meanwhile, first, the voltage Vin of the signal Ain decreases ahead of the voltage Out of the node N2 during the period P1. In other words, the voltage Out becomes a voltage higher than or equal to the voltage Vin. Accordingly, a voltage of the output signal of the differential amplifier 221 which selected as the signal Gt2 increases in accordance with the difference voltage between two voltages, and swings to a H level. If the signal Gt2 is in a H level, the transistor 232 is turned on, and thus, the voltage Out decreases. Actually, the voltage Out is not decreased to the ground Gnd immediately, and is decreased slowly in time integration by the capacitor C0, the piezoelectric element Pzt with capacitance, or the like.

If the voltage Out decreases to be lower than the voltage Vin, the signal Gt2 is in a L level, and the transistor 232 is turned off, but since the voltage Vin is low, the voltage Out increases to be higher than or equal to the voltage Vin again. Accordingly, the signal Gt2 is in a H level, and thereby, the transistor 232 is turned on again.

During the period P1, the signal Gt2 is alternately switched between a H level and a L level, and thereby, the transistor 232 performs an operation of repeating turn-on and turn-off, that is, a switching operation. By the switching operation, control of causing the voltage Out to follow a decrease of the voltage Vin is performed.

Next, the period P2 is a period in which the drive signal COM-A (Ain) is constant at the minimum value min of a voltage lower than the threshold voltage Vth1. Accordingly, the signal OCa is in a H level subsequent to the period P1 during the period P2, and thus, the selector 223 selects a H level as the signal Gt1 and selects the output signal of the differential amplifier 221 as the signal Gt2.

The voltage Out is controlled to follow the voltage Vin during the period P1, but content of the control is the switching operation of the transistor 232 as described above. Accordingly, there is a case where, shortly after the period P2 starts, that is, shortly after the voltage Vin turns to be constant at the minimum value min, the voltage Out does not coincide with the voltage Vin.

In this case, if the voltage Out is higher than the voltage Vin, the voltage of the signal Gt2, that is, the output voltage of the differential amplifier 221 also increases, and thus, resistance between a source and a drain of the transistor 232 decreases, thereby, decreasing the voltage Out of the node N2. Meanwhile, if the voltage Out is lower than the voltage Vin, the voltage of the signal Gt2 also decreases, and thus, the resistance between the source and the drain of the transistor 232 increases, thereby, increasing the voltage Out.

Hence, during the period P2, the voltage Out becomes constant at a point where a direction in which the voltage Out decreases and a direction in which the voltage increases balance each other, that is, a point where the voltage Out coincides with the voltage Vin (minimum value min). At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin.

FIG. 18 illustrates a state where the voltage of the signal Gt2 changes briefly from the period P1 to the period P2 thereby becoming immediately constant.

The period P3 is a voltage increase period of the drive signal COM-A (Ain). Accordingly, the signal OCa is in a L level during the period P3, and thus, the selector 223 selects the output signal of the differential amplifier 221 as the signal Gt1, and selects a L level as the signal Gt2.

The signal Gt2 is in a L level during the period P3, and thus, the N-channel transistor 232 is turned off.

Meanwhile, first, the voltage Vin increases ahead of the voltage Out during the period P3. In other words, the voltage Out decreases to be lower than the voltage Vin. Accordingly, the voltage of the output signal of the differential amplifier 221 which is selected as the signal Gt1 decreases in accordance with the difference voltage between two voltages, and approximately swings to a L level. If the signal Gt1 is in a L level, the transistor 231 is turned on, and thus, the voltage Out increases. Actually, the voltage Out is not increased to the voltage $V_D$ immediately, and is increased slowly in time integration by the capacitor C0, the piezoelectric element Pzt with capacitance, or the like.

If the voltage Out is in a voltage higher than or equal to the voltage Vin, the signal Gt2 is in a H level, and the transistor 231 is turned off. If the transistor 231 is turned off, an increase of the voltage Out is stopped, but since the voltage Vin increases, the voltage Out decreases to be lower than the voltage Vin again. Accordingly, the signal Gt1 is in a L level, and the transistor 231 is turned on again.

The signal Gt1 is alternately switched between a H level and a L level during the period P3, and thereby, the transistor 231 performs a switching operation. By the switching operation, control of causing the voltage Out to follow an increase of the voltage Vin is performed.

The period P4 is a period in which the drive signal COM-A (Ain) is constant at a voltage higher than or equal to the threshold voltage Vth1. Accordingly, during the period P2, the signal OCa is in a L level subsequent to the period P3, and thus, the selector 223 selects the output signal of the differential amplifier 221 as the signal Gt1, and selects a L level as the signal Gt2.

The voltage Out is controlled to follow the voltage Vin during the period P3, but content of the control is the switching operation of the transistor 231 as described above, and thus, there is a case where, shortly after the voltage Vin turns to be constant at the maximum value max during the period P4, the voltage Out does not coincide with the voltage Vin of the signal Ain.

In this case, if the voltage Out is higher than the voltage Vin, the voltage of the signal Gt1, that is, the output voltage of the differential amplifier 221 also increases, and thus, resistance between a source and a drain of the transistor 231 increases, thereby, decreasing the voltage Out of the node N2. Meanwhile, if the voltage Out is lower than the voltage Vin, the voltage of the signal Gt1 also decreases, and thus, the resistance between the source and the drain of the transistor 231 decreases, thereby, increasing the voltage Out.

Hence, during the period P4, the voltage Out becomes constant at a point where a direction in which the voltage Out decreases and a direction in which the voltage increases balance each other, that is, a point where the voltage Out coincides with the voltage Vin (maximum value max). At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin (maximum value max).

FIG. 18 illustrates a state where the voltage of the signal Gt2 changes briefly from the period P3 to the period P4 thereby becoming immediately constant.

The period P5 is a voltage decrease period of the drive signal COM-A (Ain). Accordingly, an operation in the period P5 is the same as in the period P1. That is, the signal Gt2 is alternately switched between a H level and a L level, and thereby, the transistor 232 performs a switching operation, and control of causing the voltage Out of the node N2 to follow a decrease of the voltage Vin is performed. In relation to the period P4, the signal OCa is switched to a H level during the period P5, and thus, the selector 223 selects a H level as the signal Gt1, and selects the output signal of the differential amplifier 221 as the signal Gt2.

A period P6 subsequent to the period P5 is a period in which the drive signal COM-A (Ain) is constant at the voltage Vcen lower than the threshold voltage Vth1. Accordingly, the signal OCa is in a H level subsequent to the period P5 during the period P6, and thus, the selector 223 selects a H level as the signal Gt1 and selects the output signal of the differential amplifier 221 as the signal Gt2.

The control of causing the voltage Out to follow the voltage Vin of the signal Ain is performed during the period P5, but there is a case where, shortly after the voltage Vin turns to be constant at the voltage Vcen during the period P6, the voltage Out does not coincide with the voltage Vin of the signal Ain. However, the voltage Out is constant at a point in which the voltage coincides with the voltage Vin (Vcen), in the same manner shortly after being turned to the period P2. At this time, the transistor 232 performs a linear operation, and the signal Gt2 is constant at a voltage in which the voltage Out that is determined by the resistance between the source and the drain of the transistor 232 and the resistance elements Ru and Rd becomes the voltage Vin (Vcen).

FIG. 18 illustrates a state where the voltage of the signal Gt2 changes briefly from the period P5 to the period P6 thereby being immediately balanced.

According to the drive circuit (comparative example) illustrated in FIG. 17, the control of causing the voltage Out of the drive signal COM-A to follow the voltage Vin of the signal Ain is performed by the following operation for each of the periods P1 to P6.

That is, the controls of causing the voltage Out to follow the voltage Vin are performed, by the switching operation of the transistor 232 during the periods P1 and P5 in which the voltage Vin decreases, by the linear operation of the transistor 232 during the period P2 and P6 in which the voltage Vin is constant at a value lower than the threshold voltage Vth1, by the switching operation of the transistor 231 during the period P3 in which the voltage Vin increases, and by the linear operation of the transistor 231 during the period P4 in which the voltage Vin is constant at a value higher than the threshold voltage Vth1, respectively.

Description is made in which, in the drive circuit (comparative example), the transistor 231 performs a switching operation during the period P3 in which the output voltage VOUT (the voltage Vin of the signal Ain) of the drive signal COM-A increases, and the transistor 232 performs a switching operation during the periods P1 and P5 in which the output voltage VOUT decreases, but in a case where the number of piezoelectric elements Pzt to be coupled is large, a linear operation can also be performed in a relationship of a time constant which is determined by ON-resistance of a transistor and a load capacitance.

In addition, description is made in which, in the drive circuit (comparative example), the transistor 231 performs a linear operation during the period P4 in which the voltage Vout is constant at a voltage higher than or equal to the threshold voltage Vth1, and the transistor 232 performs a linear operation during the periods P2 and P6 in which the voltage Vout is constant at a voltage lower than the threshold voltage Vth1, but a switching operation can also be performed by the same reason.

According to the drive circuit (comparative example), transistors 231 and 232 do not perform a switching operation during the periods P2, P4, and P6 in which the voltage Vin is constant, compared with the class D amplification in which switching is continuously performed. In addition, in the class D amplification, a low pass filter (LPF) for demodulating a switching signal, particularly, an inductor such as a coil is needed, but in the drive circuit (comparative example), the LPF is not needed. Accordingly, according to the class D amplification, it is possible to reduce power which is consumed by a switching operation or the LPF, and also to simplify and minimize a circuit, compared with the drive circuit (comparative example).

In this way, the drive circuit (comparative example) has many excellent points, compared with the class D amplification, but the following problems are pointed out. As described above, the control of causing the voltage Out of the drive signal COM-A to follow the voltage Vin of the signal Ain is performed basically by the switching operations of the transistors 231 and 232 during the voltage increase period or the voltage decrease period, and is performed by the linear operation of the transistors 231 and 232 during the voltage-constant period. Accordingly, when the switching operation is changed to the linear operation, that is, when the voltage increase period or the voltage decrease period is changed to the voltage-constant period, deviation of the voltage Out with respect to the voltage Vin can increase.

Figure 19:
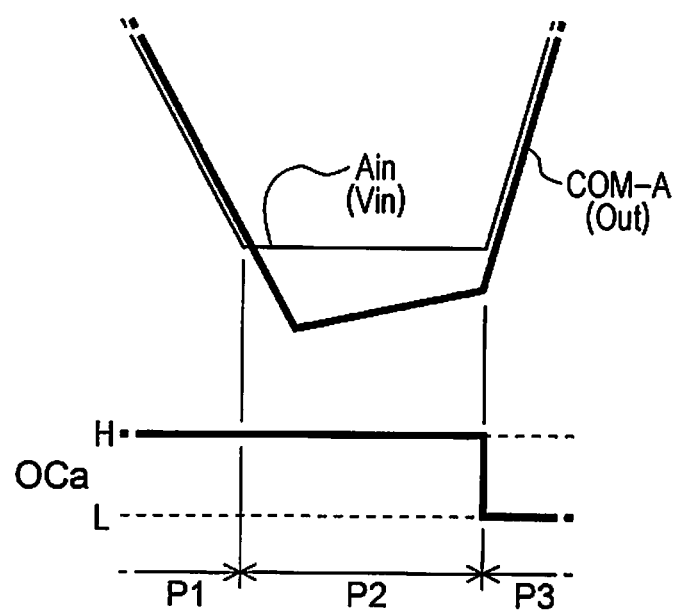
FIG. 19 is a diagram illustrating an operation of the drive circuit (comparative example).

FIG. 19 is a diagram illustrating an example in which the deviation of the voltage Out with respect to the voltage Vin increase. FIG. 18 illustrates a part surrounded by a dashed line Bt, that is, an enlarged waveform or the like of the drive signal COM-A when the period P1 is changed to the period P2.

In this figure, a thin line indicates a waveform of the signal Ain (voltage Vin) which is an input, and a bold line indicates a waveform of the drive signal COM-A (voltage Out) which is an output. This figure illustrates an example in which, as the voltage Vin of the signal Ain decreases, the voltage Out of the drive signal COM-A is decreased by a switching operation, but when the voltage Vin is constant, the deviation of the voltage Out with respect to the voltage Vin increases.

The example of FIG. 19 illustrates a case where the voltage Vin changes from a decreasing state to a constant state, but the same problem can occur even in a case where the voltage Vin changes from an increasing state to a constant state. However, the P-channel transistor 231 which increases the voltage Out has a slower response than the N-channel transistor 232 in general, and thus, it is considered that a possibility that deviation is increased by overshoot shortly after the switching operation ends is low.

In contrast to the drive circuit (comparative example), the drive circuit (Example 1) according to the present embodiment includes the differential amplifier 225 and the pulse inserter 227 which are illustrated in FIG. 10.

Figure 11:
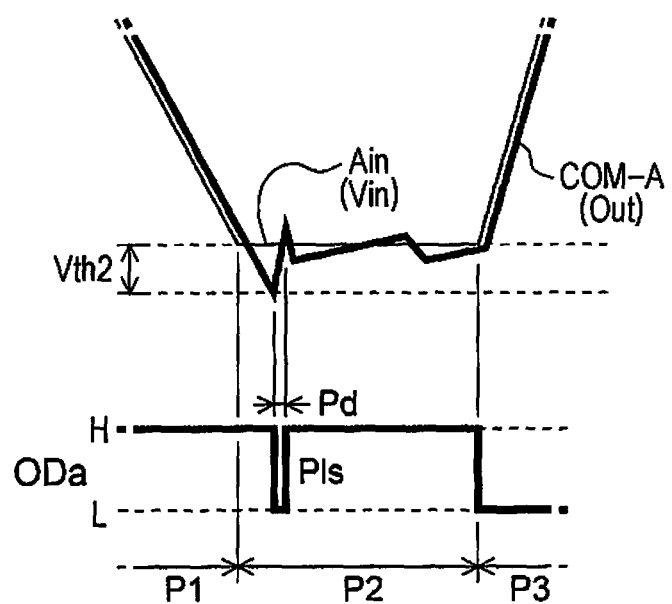
FIG. 11 is a diagram illustrating an operation of the drive circuit (Example 1).

FIG. 11 is a diagram illustrating an operation of the drive circuit (Example 1), and illustrates a state where, in a case where the voltage Vin of the signal Ain changes from a decreasing state to a constant state, when deviation of the voltage Out with respect to the voltage Vin is higher than or equal to the threshold value Vth2 in view of an absolute value, the pulse inserter 227 inserts the pulse Pls with a width of a period Pd into the signal OCa to output as the signal ODa.

The transistor 232 is forcibly turned off and the transistor 231 is forcibly turned on by the pulse Pls, and thus, the voltage Out of the drive signal COM-A increases so as to remove the deviation. After the voltage Out is increased by the pulse Pls, the voltage Out follows the voltage Vin by aforementioned switching operation.

In FIG. 11, a case where the voltage Vin changes from a decreasing state to a constant state is used as an example, but deviation may increase even in a case where the voltage Vin changes from an increasing state to a constant state in the same manner.

In a case where the voltage Vin changes from an increasing state to a constant state, when deviation of the voltage Out with respect to the voltage Vin is higher than or equal to the threshold value Vth2 in view of an absolute value, the pulse inserter 227 inserts the pulse Pls into the signal OCa with a L level to output as the signal ODa, while not illustrated in particular, and thus, the transistor 231 is forcibly turned off and the transistor 232 is forcibly turned on. Thereby, the voltage Out of the drive signal COM-A decreases to remove the deviation. After the voltage Out decreases, the voltage Out follows the voltage Vin by aforementioned linear operation.

Hence, according to the drive circuit (Example 1), deviation of the drive signal COM-A with respect to the signal Ain which is an input, particularly, deviation occurring when a voltage with a trapezoidal waveform changes from a decreasing state or an increasing state to a constant state is reduced, and thus, waveform reproducibility is improved. Accordingly, accuracy of ink ejection increases, and as a result, it is possible to obtain results of high quality print.

The drive signal COM-A (COM-B) is not limited to a trapezoidal waveform, and may be a waveform with continuous slope, such as a sine wave. In the drive circuit (Example 1), in a case where the waveform is output, if a change of the voltage Vout (voltage Vin of the signal Ain) of the drive signal COM-A is relatively large, specifically, one of the transistors 231 and 232 performs a switching operation during a period in which a voltage changes to a predetermined voltage or higher on a per unit time basis. Meanwhile, if the change of the voltage Vout is relatively small, specifically, one of the transistors 231 and 232 performs a linear operation during a period (second period) in which the voltage changes to a voltage lower than the predetermined voltage on a per unit time basis or the voltage is constant without a change.

In addition, in the drive circuit (Example 1), a destination of pull-up of the resistance element Ru may be a voltage higher than or equal to a maximum voltage of the drive signal COM-A, and thus, the destination is a power supplying line of the voltage $V_D$ in this example. In addition, a destination of pull-down of the resistance element Rd may be a voltage lower than or equal to a minimum voltage of the drive signal COM-A, and thus, the destination is the ground Gnd in this example.

Here, the drive circuit 120a which outputs the drive signal COM-A is described as an example, but the drive circuit 120b which outputs the drive signal COM-B also performs the same operation. A waveform of the drive signal COM-B is the same as the waveform illustrated in FIG. 5, the signal OCb is the same as described above, and thus, a waveform thereof is not illustrated. The drive circuit 120b also outputs the drive signal COM-B of the voltage Vout following the voltage of the signal Bin.

However, in the configuration illustrated in FIG. 10, the resistance elements Ru and Rd are coupled electrically and directly between the voltage $V_D$ of the power supply and the ground Gnd, and thus, a through-current continuously flows, and there is room for reducing power consumption. Hence, next, a drive circuit (Example 2) having a different configuration whose power consumption is reduced will be described.

Figure 12:
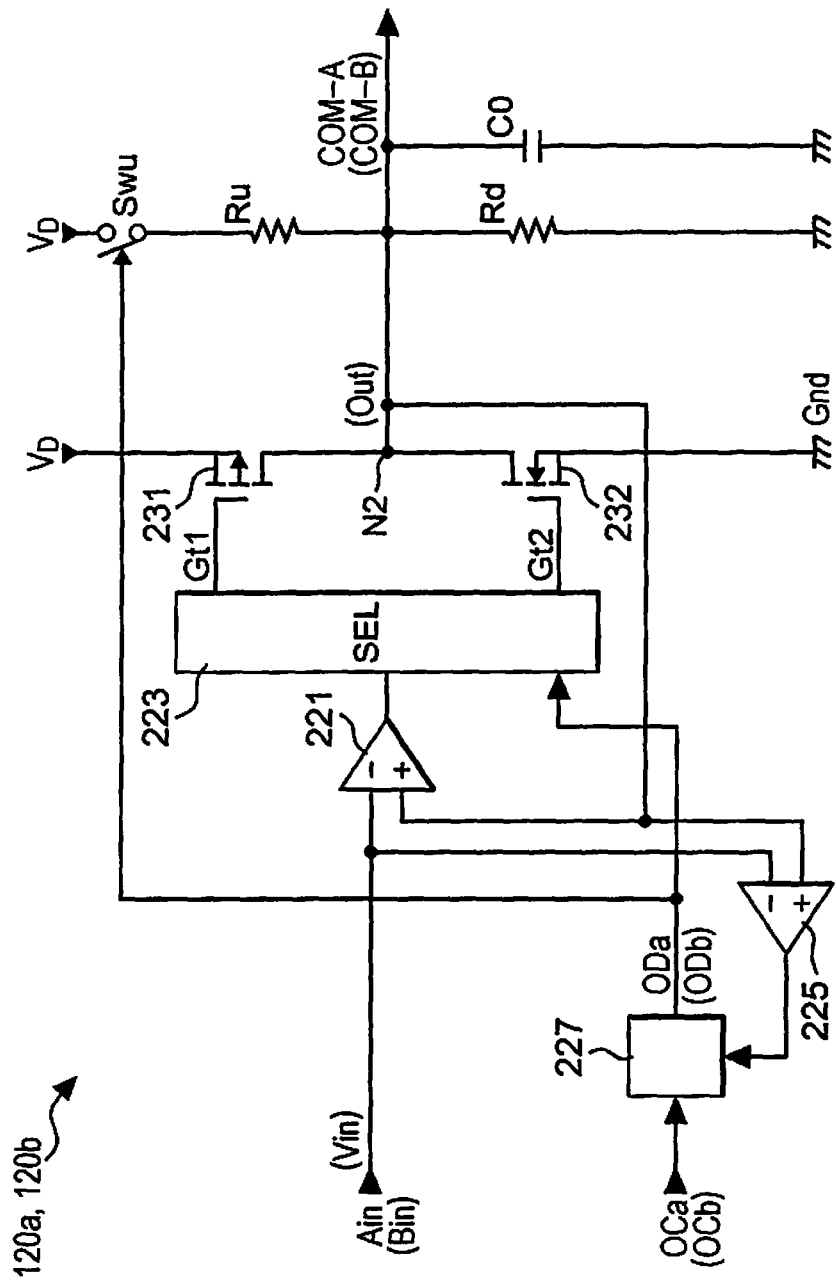
FIG. 12 is a diagram illustrating a drive circuit (Example 2).

FIG. 12 is a diagram illustrating a configuration of the drive circuit (Example 2). The drive circuit (Example 2) illustrated in the figure is different from the drive circuit (Example 1) illustrated in FIG. 10 in that the drive circuit (Example 2) includes a switch Swu. The switch Swu is electrically coupled to the resistance element Ru in series between the power supplying line of the voltage $V_D$ on a high side of the power supply voltage and the node N2, is turned on if the signal OCa is in a H level, and is turned off if the signal OCa is in a L level. Accordingly, in a case where the output signal of the differential amplifier 221 is selected by the selector 223 as the signal Gt1, that is, during the periods P1, P2, P5, and P6, the switch Swu is turned on. Meanwhile, in a case where the output signal of the differential amplifier 221 is selected as the signal Gt2, that is, during the periods P3 and P4, the switch Swu is turned off. Accordingly, the drive circuit (Example 2) can reduce power which is consumed by the through-current, compared with the drive circuit (Example 1) illustrated in FIG. 10.

In the drive circuit (Example 2), the switch Swu is provided on a side of the resistance element Ru for pull-up, but a configuration in which another switch is provided on a side of the resistance element Rd for pull-down may be provided. In the configuration, the switch may be turned on when the signal OCa is in a L level, and may be turned off when the signal OCa is in a H level. In addition, as will be described below, ON and OFF of the switch on a pull-up side may be controlled differently from ON and OFF of the switch on a pull-down side.

Here, functions of pull-up and pull-down of the node N2 will be described.

A case where pull-up is required is a case where the transistor 232 performs a linear operation during the periods P2 and P6 in which the signal Ain (the drive signal COM-A) is constant at a voltage lower than the threshold value Vth1. In this case, the transistor 231 on a high side is turned off, and thus, it is necessary for the node N2 to be pulled up on a high side such that the voltage Out of the node N2 follows the signal Ain by the transistor 232. In other words, the switch Swu may be in a state of being turned on during the periods P2 and P6.

Meanwhile, a case where pull-down is required is a case where the transistor 231 performs a linear operation during the period P4 in which the signal Ain (the drive signal COM-A) is constant at a voltage higher than the threshold value Vth1. In this case, the transistor 232 on a low side is turned off, and thus, it is necessary for the node N2 to be pulled down on a low side such that the voltage Out of the node N2 follows the signal Ain by the transistor 231. The switch provided on the pull-down side may be in a state of being turned on during the period P4.

Hence, in the drive circuit (Example 1), the transistor 231 or 232 is turned on by the pulse Pls so as to reduce deviation of the voltage Out with respect to the voltage yin, but a configuration in which the deviation is reduced can also be used for the following drive circuit (Example 3).

Accordingly, the drive circuit (Example 4) will be described hereinafter.

Figure 13:
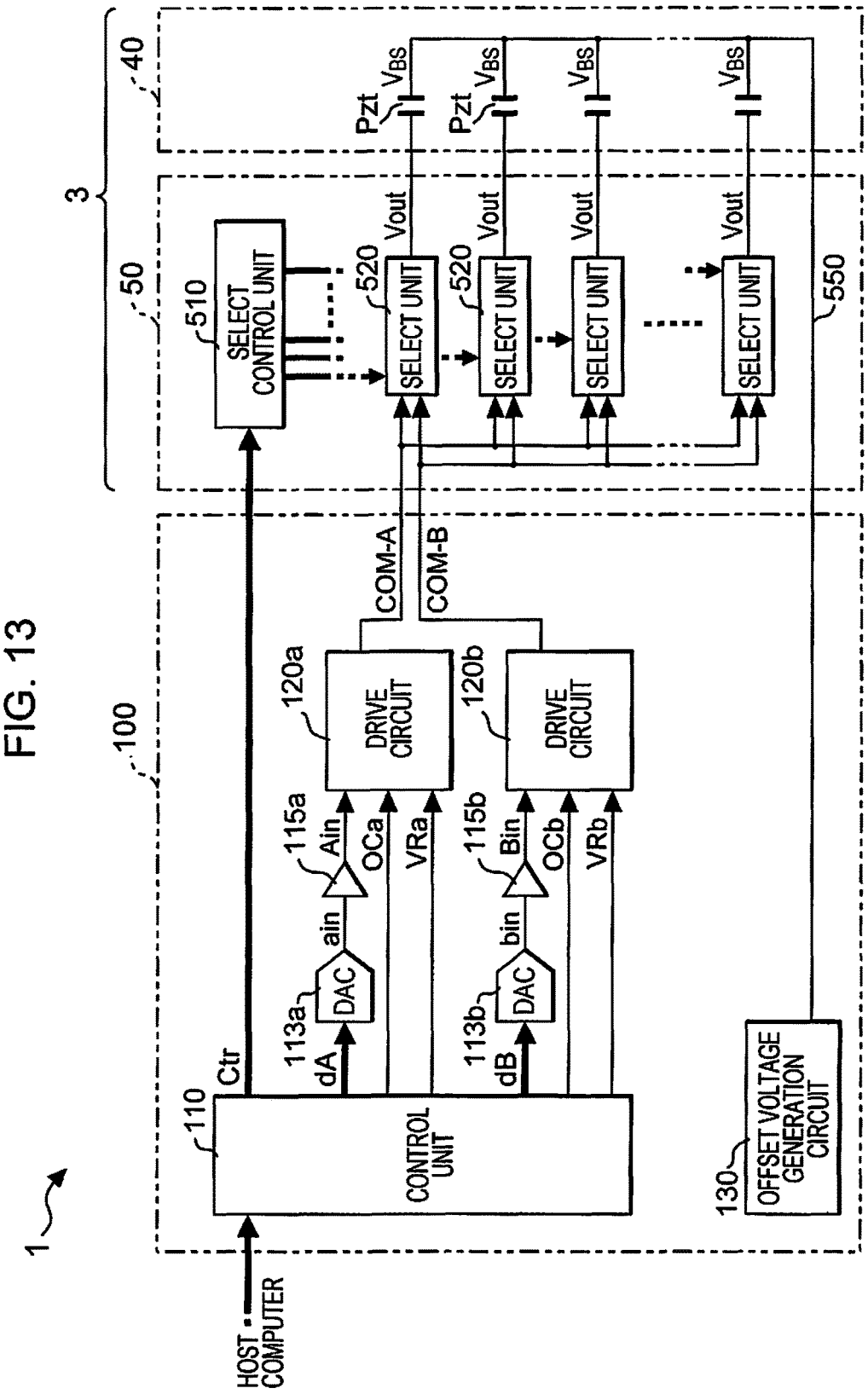
FIG. 13 is a block diagram illustrating an electrical configuration of a printing apparatus (Example 2).

FIG. 13 is a block diagram illustrating an electrical configuration of a printing apparatus (Example 2) including the drive circuit (Example 3). A difference between the printing apparatus (Example 2) illustrated in this figure and the printing apparatus (Example 1) illustrated in FIG. 4 is that the control unit 110 supplies a signal VRa to the drive circuit 120a and supplies a signal VRb to the drive circuit 120b.

In this example, the control unit 110 outputs the signals VRa and VRb, each having a H level.

Figure 14:
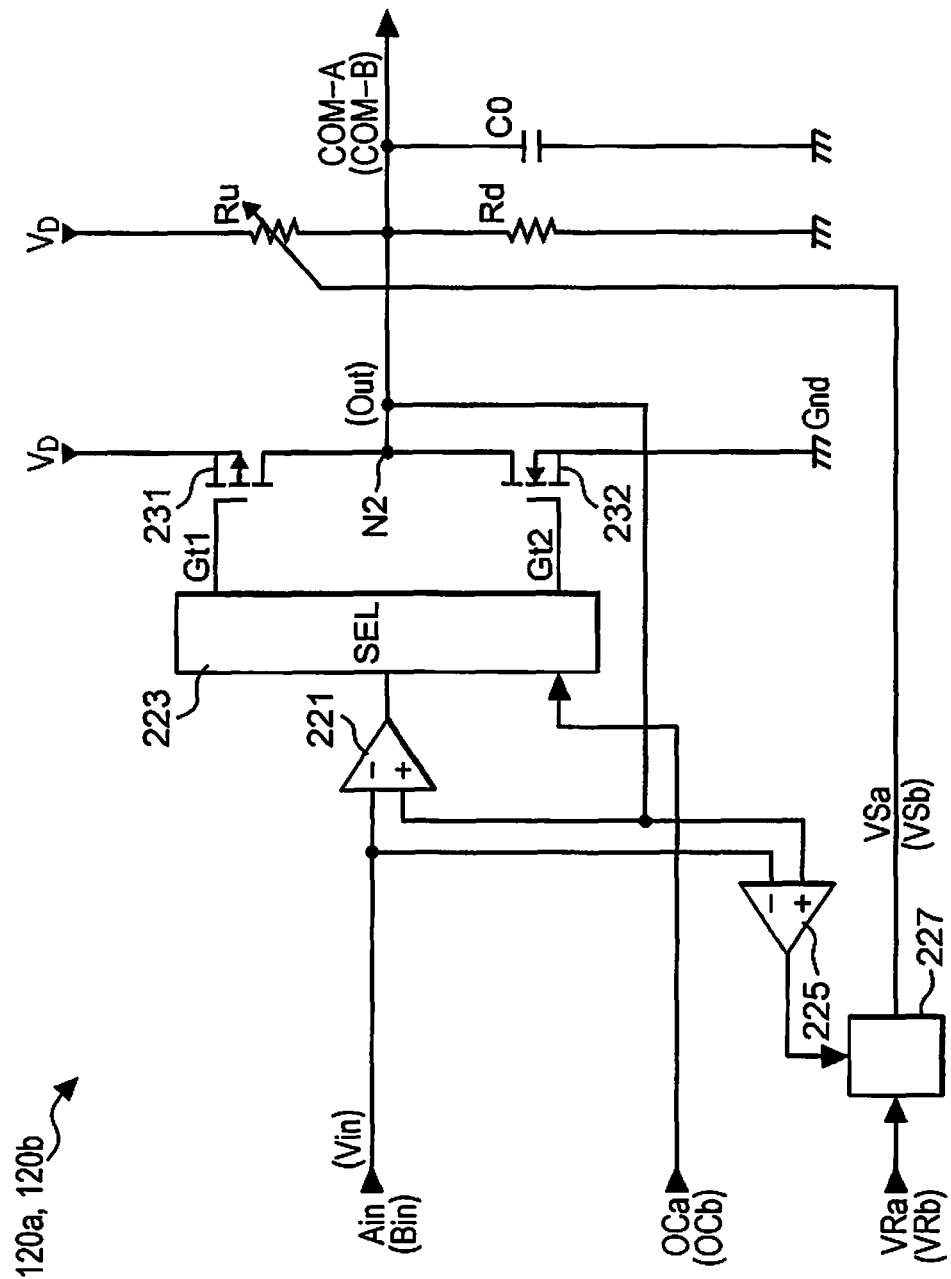
FIG. 14 is a diagram illustrating a drive circuit (Example 3) which is applied to the printing apparatus (Example 2).

FIG. 14 is a diagram illustrating a configuration of the drive circuit (Example 3). A difference between the drive circuit (Example 3) illustrated in this figure and the drive circuit (Example 1) illustrated in FIG. 10 is first that the resistance element Ru is replaced with a variable resistor.

In this example, the resistance element Ru can be switched by two levels of a high level and low level, and in detail, the resistance element Ru is set to have high resistance if a signal VSa is in a H level, and is set to have low resistance if the signal VSa is in a L level.

In addition, in the drive circuit (Example 3), the pulse inserter 227 is provided on a side on which the signal VRa is supplied from the control unit 110. In detail, if a voltage of a signal which is output from the differential amplifier 225 is higher than or equal to the threshold value Vth2, the pulse inserter 227 inverts a logic level of the signal VRa at that time for a predetermined time to output as the signal VSa. That is, if a difference between the voltage Vin and the voltage Out is higher than or equal to the threshold value Vth2, the pulse inserter 227 inserts a pulse into the signal VRa to output as the signal VSa.

Figure 15:
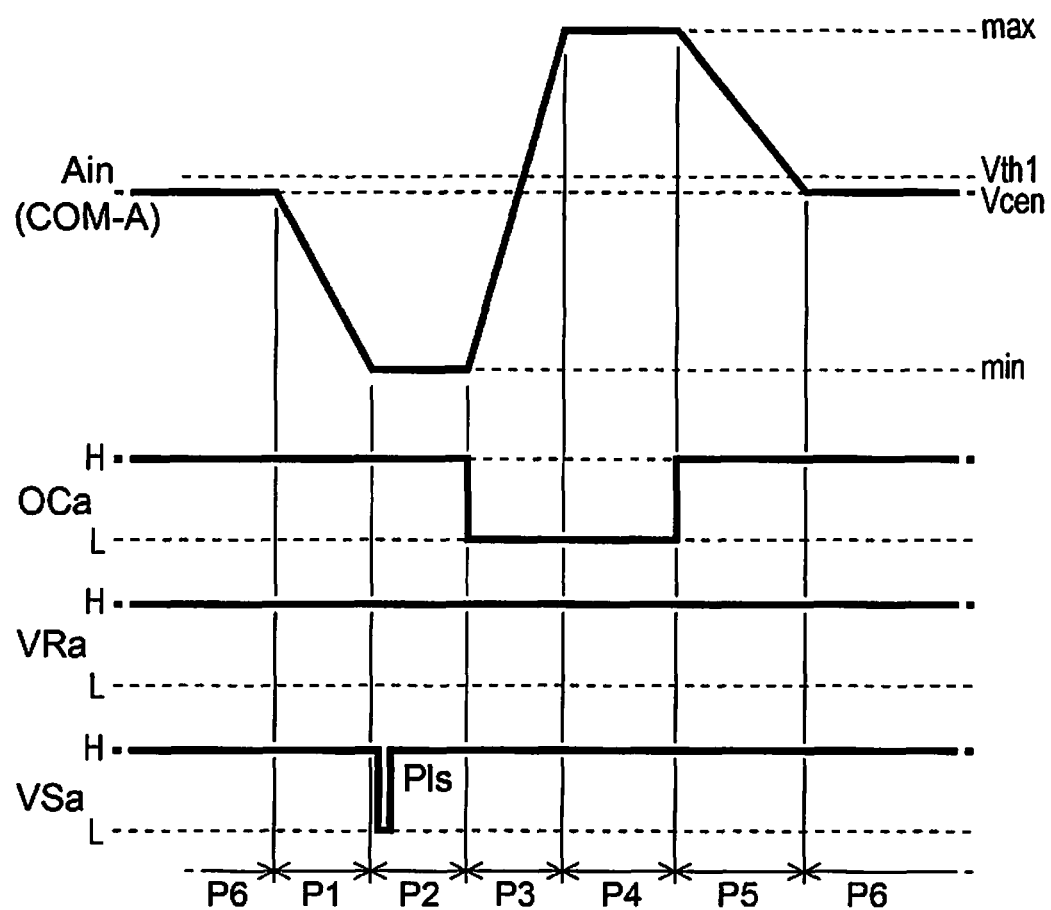
FIG. 15 is a diagram illustrating an operation of a drive circuit (Example 3).

FIG. 15 is a diagram illustrating an operation of the drive circuit (Example 3). In this figure, the pulse Pls is inserted into the signal VRa by the pulse inserter 227 at a next location U1.

That is, the location U1 is a point in which deviation of the voltage Out with respect to the voltage Vin is higher than or equal to the threshold value Vth2 in view of an absolute value, after the voltage Vin of the signal Ain changes from a decreasing state to a constant state.

The signal VSa is changed to a L level by the pulse Pls at the location U1, and thereby, a resistance value of the resistance element Ru is reduced, pull-up of the node N2 increases, the voltage Out increases, and deviation of the voltage Out with respect to the voltage Vin is reduced in the same manner as the drive circuit (Example 1).

After the voltage Vin of the signal Ain changes from the increasing state to the constant state, the deviation of the voltage Out with respect to the voltage Vin can also be higher than or equal to the threshold value Vth2 in view of an absolute value. However, as described above, the P-channel transistor 231 has a relatively slow response, and thus, it is considered that a possibility that the deviation is increased by overshoot shortly after the switching operation ends is low, but in order to reduce the deviation, for example, the following configuration may be provided.

That is, a configuration may be provided in which the resistance element Rd on a pull-down side is replaced with a variable resistor and resistance of the resistance element Rd is reduced to decrease the voltage Out when the deviation of the voltage Out with respect to the voltage Vin is higher than or equal to the threshold value Vth2 in view of an absolute value during a period in which the transistor 231 is activated (that is, a period in which the signal OCa is in a L level).

In the configuration, in relation to the resistance element Ru on a pull-up side, resistance of the resistance element Ru is reduced to increase the voltage Out when the deviation of the voltage Out with respect to the voltage Vin is higher than or equal to the threshold value Vth2 in view of an absolute value during a period in which the transistor 232 is activated (that is, a period in which the signal OCa is in a H level).

Here, the drive circuit 120a which outputs the drive signal COM-A will be described, but a configuration of the drive circuit 120b which outputs the drive signal COM-B is the same as the drive circuit 120a, and only an input signal is different from each other. That is, in the drive circuit 120b, an input of the pulse inserter 227 becomes the signal VRb and an output thereof becomes VSb, as denoted by parenthesis of FIG. 14.

The drive circuit (Example 3) may also include a switch which prevents a through-current from continuously flowing. Hence, the drive circuit (Example 4) which is configured by adding the switch to the drive circuit (Example 3) will be described hereinafter.

Figure 16:
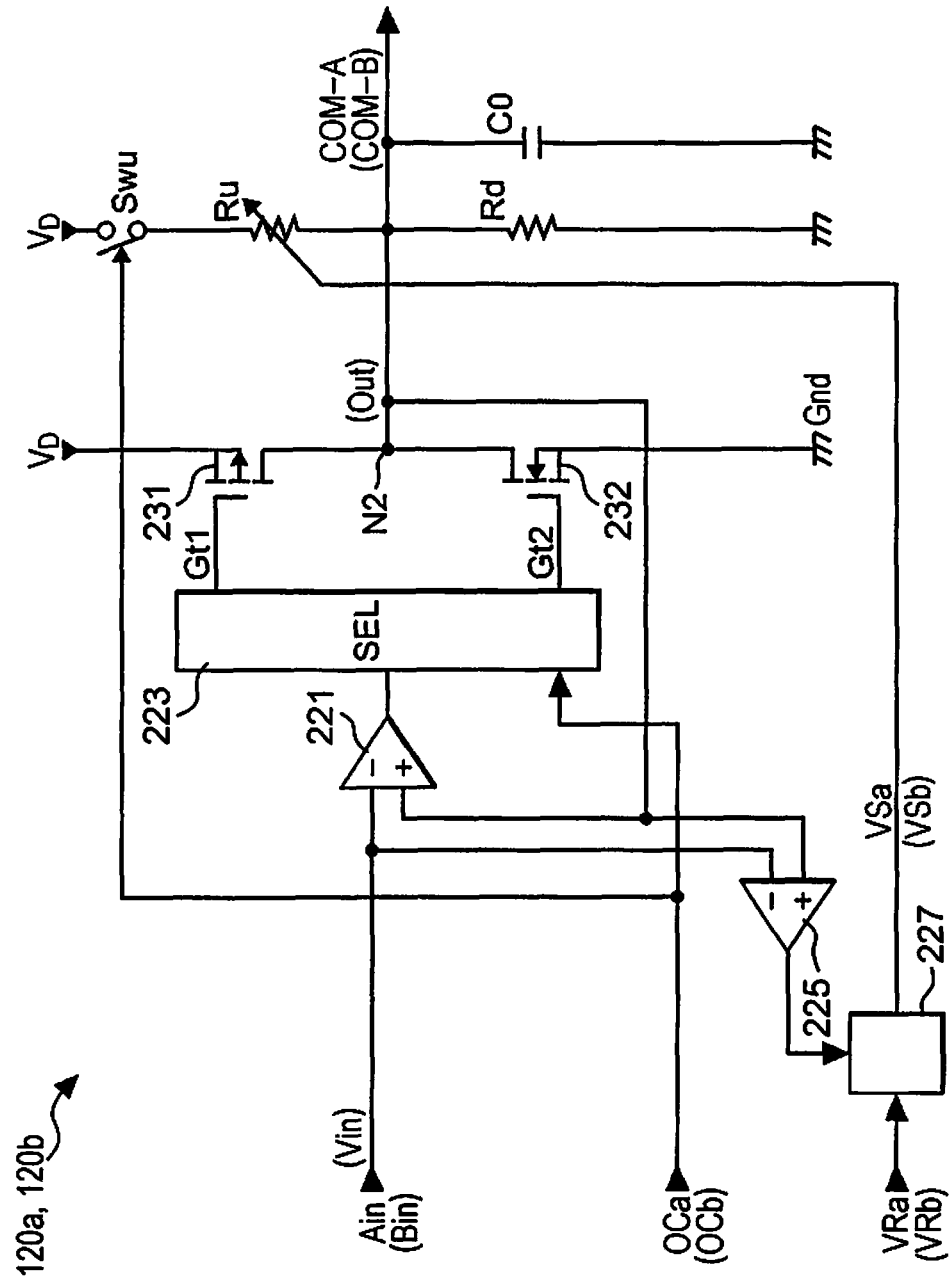
FIG. 16 is a diagram illustrating a drive circuit (Example 4).

FIG. 16 is a diagram illustrating a configuration of the drive circuit (Example 4).

A difference between the drive circuit (Example 4) illustrated in this figure and the drive circuit (Example 3) illustrated in FIG. 14 is that the drive circuit (Example 4) includes the switch Swu. The switch Swu is the same manner as in the drive circuit (Example 2), and is turned on in a case where the output signal of the differential amplifier 221 is selected by the selector 223 as the signal Gt1, that is, during the periods P1, P2, P5, and P6. Meanwhile, the switch Swu is turned off in a case where the output signal of the differential amplifier 221 is selected as the signal Gt2, that is, during the periods P3 and P4. Accordingly, according to the drive circuit (Example 4), power which is consumed by a through-current can be further reduced, compared with the drive circuit (Example 3) illustrated in FIG. 14.

In the drive circuit (Example 4), a configuration in which another switch is provided on a side of the resistance element Rd for pull-down may be provided. In the configuration, the switch may be turned on when the signal OCa is in a L level, and may be turned off when the signal OCa is in a H level. In addition, ON and OFF of the switch on a pull-up side may be controlled differently from ON and OFF of the switch on a pull-down side.

In a case where the resistance elements Ru and Rd are variable transistors, a configuration may be provided in which the resistance elements are not switched by two levels of high resistance and low resistance by the signal VSa (VSb) and are switched by three levels or higher. In the configuration, a configuration may be provided in which a plurality of resistance elements are switched by the signal VSa (VSb) which is data with two bits or more.

The invention is not limited to the aforementioned embodiments, and for example, various modifications and applications which will be described below can be made. Aspects of the modifications and application which will be described below and are selected arbitrarily or a plurality of aspects can also be combined appropriately.

In order to reduce deviation of the voltage Out with respect to the voltage Vin, the pulse Pls is inserted, and thereby, one of a configuration in which one transistor which reduces the deviation among the transistors 231 and 232 is turned on in the same manner as in the drive circuit (Example 1, Example 2), and, second, a configuration in which resistance of the resistance element Ru for pull-up (the resistance element Rd for pull-down) is reduced in the same manner as in the drive circuit (Example 3, Example 4), may also be selected.

The signal OCa (OCb) can be generated by another circuit without being output from the control unit 110, by analyzing the data dA (dB) as follows.

For example, In relation to the data dA (dB), discrete values (data) which are temporally adjacent to each other, compared to each other, and if the discrete values are equal, the values are in a voltage-constant period, and by determining the discrete values in the constant period, it is possible to determine whether or not a voltage in the constant period is higher than or equal to the threshold voltage Vth1. In addition, if, when voltage conversion is performed, the discrete value which is temporally later is larger than the discrete value which is temporally prior among the discrete values the value is in a voltage increase period, and if, when voltage conversion is performed, the discrete value which is temporally later is smaller than the discrete value which is temporally prior, the value is in a voltage decrease period.

A signal which is obtained by performing analog conversion may be analyzed in the same manner as above, while not in the data dA (dB).

In addition, the drive circuit (Example 1, Example 2, Example 3, Example 4) may include a diode for blocking a current flowing from the node N2 toward a drain terminal of the transistor 231 and a diode for blocking a current flowing from a drain terminal of the transistor 232 toward the node N2.

In the drive circuit (Example 1, Example 2, Example 3, Example 4) the transistor 231 is configured by a P-channel transistor and the transistor 232 is configured by an N-channel transistor, but both the transistors 231 and 232 may be P-channel transistors or N-channel transistors. However, an output signal of the differential amplifier 221, a gate signal at the time of being off by the signal OCa (OCb), and the like need to be appropriately combined.

In the above description, the liquid ejecting apparatus is described as a printing apparatus, but the liquid ejecting apparatus may be a three-dimensional shaping apparatus which ejects liquid to form a three-dimensional object, a textile printing apparatus which ejects liquid to print onto a textile, or the like.

In addition, the drive circuit is provided in the main substrate 100, but may be configured to be provided in the carriage 20 (or the head unit 3) together with the drive IC 50. If the drive circuit is provided in the head unit 3, it is not necessary to supply a signal with a large amplitude through the flexible flat cable 190, and thus, it is possible to improve anti-noise characteristics.

Furthermore, in the above description, an example is described in which the piezoelectric element Pzt for ejecting ink is used as a drive target of the drive circuit 120a (120b), but when considering the drive circuit 120a (120b) which is separated from the printing apparatus, the drive target is not limited to the piezoelectric element Pzt, and can be applied to all of a load with capacitive components, such as an ultrasonic motor, a touch panel, an electrostatic speaker, or a liquid crystal panel.

What is claimed is:

1. A liquid ejecting apparatus comprising:
an ejecting unit that includes a piezoelectric element which is displaced by a drive signal being applied to the piezoelectric element and ejects liquid in accordance with displacement of the piezoelectric element;
a first differential amplifier that outputs an output signal based on a source drive signal and the drive signal;
a second differential amplifier that receives the source drive signal and the drive signal;
a pair of transistors that include a high-side transistor and a low-side transistor which are controlled based on the output signal and outputs the drive signal from an output terminal;
a selector that selects one of the high-side transistor and the low-side transistor and supplies the output signal to the selected transistor;
a first resistance element connected with the output terminal;
a second resistance element connected with the output terminal;
a controller including a CPU that outputs a control signal; and
a pulse inserter that inserts a pulse into the control signal, wherein
the first resistance element or the second resistance element has a variable resistance value, and
the controller controls the second differential amplifier to adjust the resistance value based on a difference between a voltage of the source drive signal and a voltage of the drive signal by causing the pulse inserter to insert a pulse into the control signal and output the signal to the first resistance element or the second resistance element.

2. The liquid ejecting apparatus according to claim 1, wherein
a resistance value of the first resistance element or a resistance value of the second resistance element varies when a voltage of the drive signal is constant.

3. The liquid ejecting apparatus according to claim 1, wherein the selector selects a transistor to which the control signal is supplied, based on a logic level of a predetermined select signal, and the select signal designates selection in the selector, based on a voltage of the source drive signal.

4. The liquid ejecting apparatus according to claim 1, wherein the selector selects the high-side transistor in a period in which a voltage of the drive signal increases, and selects the low-side transistor in a period in which the voltage of the drive signal decreases.

5. The liquid ejecting apparatus according to claim 1, wherein the selector selects the high-side transistor in a period in which the drive signal is constant at a voltage higher than or equal to a predetermined threshold voltage, and the selector selects the low-side transistor in a period in which the drive signal is constant at a voltage lower than the predetermined threshold voltage.

6. The liquid ejecting apparatus according to claim 5, wherein the threshold voltage is lower than a maximum value of a voltage of the drive signal, and is higher than a minimum value of the voltage of the drive signal.

7. A drive circuit that drives a capacitive load using a drive signal, comprising:

a first differential amplifier that outputs an output signal based on a source drive signal and the drive signal;

a second differential amplifier that receives the source drive signal and the drive signal;

a pair of transistors that include a high-side transistor and a low-side transistor which are controlled based on the output signal and outputs the drive signal from an output terminal;

a selector that selects one of the high-side transistor and the low-side transistor and supplies the output signal to the selected transistor;

a first resistance element connected with the output terminal;

a second resistance element connected with the output terminal;

a controller including a CPU that outputs a control signal; and a pulse inserter that inserts a pulse into the control signal, wherein the first resistance element or the second resistance element has a variable resistance value, and the controller controls the second differential amplifier to adjust the resistance value based on a difference between a voltage of the source drive signal and a voltage of the drive signal by causing the pulse inserter to insert a pulse into the control signal and output the control signal to the first resistance element or the second resistance element.

8. A head unit comprising:

a piezoelectric element which is displaced by a drive signal being applied to the piezoelectric element; and an ejecting unit that includes the piezoelectric element and ejects liquid in accordance with displacement of the piezoelectric element, wherein the ejecting unit is driven by a drive unit which includes a first differential amplifier that outputs an output signal based on a source drive signal and the drive signal, a second differential amplifier that receives the source drive signal and the drive signal, a pair of transistors that include a high-side transistor and a low-side transistor which are controlled based on the output signal and outputs the drive signal from an output terminal, a selector that selects one of the high-side transistor and the low-side transistor and supplies the output signal to the selected transistor, a first resistance element connected with the output terminal, a second resistance element connected with the output terminal, a controller including a CPU that outputs a control signal, and a pulse inserter that inserts a pulse into the control signal, the first resistance element or the second resistance element has a variable resistance value, and the controller controls the second differential amplifier to adjust the resistance value based on a difference between a voltage of the source drive signal and a voltage of the drive signal by causing the pulse inserter to insert a pulse into the control signal and output the signal to the first resistance element or the second resistance element.

9. The liquid ejecting apparatus according to claim 1, wherein the second differential amplifier changes the resistance value when the difference between the voltage of the source drive signal and the voltage of the drive signal is higher than or equal to a threshold value.

* * * * *